United States Patent
Sato et al.

(10) Patent No.: US 7,466,526 B2
(45) Date of Patent: Dec. 16, 2008

(54) FERROMAGNETIC TUNNEL JUNCTION, MAGNETIC HEAD USING THE SAME, MAGNETIC RECORDING DEVICE, AND MAGNETIC MEMORY DEVICE

(75) Inventors: Masashige Sato, Kawasaki (JP); Shinjiro Umehara, Kawasaki (JP); Hiroshi Ashida, Kawasaki (JP); Kazuo Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 423 days.

(21) Appl. No.: 11/257,397

(22) Filed: Oct. 25, 2005

(65) Prior Publication Data

US 2006/0256484 A1 Nov. 16, 2006

(30) Foreign Application Priority Data

May 16, 2005 (JP) ............................. 2005-142748

(51) Int. Cl.
*G11B 5/39* (2006.01)
*H01L 29/78* (2006.01)
*G11C 11/15* (2006.01)
*G11C 11/00* (2006.01)

(52) U.S. Cl. .................... 360/324.2; 257/421; 365/173

(58) Field of Classification Search ............ 360/324.1, 360/324.11, 324.12, 324.2; 257/414, 421, 257/423, 427; 365/158, 171, 173
See application file for complete search history.

(56) References Cited

U.S. PATENT DOCUMENTS

| | | | |
|---|---|---|---|
| 5,986,858 A | | 11/1999 | Sato et al. |
| 6,806,804 B2 * | | 10/2004 | Saito et al. .................. 336/200 |
| 6,818,458 B1 * | | 11/2004 | Gill ............................... 438/3 |
| 6,831,314 B2 * | | 12/2004 | Higo et al. .................. 257/295 |
| 7,045,841 B2 * | | 5/2006 | Hong et al. ................. 257/295 |
| 7,227,773 B1 * | | 6/2007 | Nguyen et al. .............. 365/158 |
| 7,333,306 B2 * | | 2/2008 | Zhao et al. ............. 360/324.12 |
| 2004/0085688 A1 | | 5/2004 | Pinarbasi |
| 2004/0257717 A1 | | 12/2004 | Sharma et al. |

(Continued)

FOREIGN PATENT DOCUMENTS

EP 1 193 694 A1 4/2002

(Continued)

OTHER PUBLICATIONS

Shinji Yuasa et al.; "Giant room-temperature magnetoresistance in single-crystal Fe/MgO/Fe magnetic tunnel junctions", Nature Materials, vol. 3, 2004, pp. 868-871. Cited in the spec.

(Continued)

*Primary Examiner*—William J Klimowicz
(74) *Attorney, Agent, or Firm*—Westerman, Hattori, Daniels & Adrian, LLP.

(57) ABSTRACT

A ferromagnetic tunnel junction is disclosed. The ferromagnetic tunnel junction includes a pinned magnetic layer, a tunnel insulating film formed on the pinned magnetic layer, and a free magnetic multilayer body formed on the tunnel insulating film. The free magnetic multilayer body includes a first free magnetic layer, a diffusion barrier layer, and a second free magnetic layer stacked in this order on the tunnel insulating film. The first free magnetic layer and the second free magnetic layer are ferromagnetically coupled with each other. The diffusion barrier layer inhibits the additive element contained in the first free magnetic layer from diffusing into the second free magnetic layer.

9 Claims, 15 Drawing Sheets

U.S. PATENT DOCUMENTS

| | | |
|---|---|---|
| 2004/0257719 A1 | 12/2004 | Ohba et al. |
| 2005/0057863 A1 | 3/2005 | Horng et al. |
| 2005/0110004 A1* | 5/2005 | Parkin et al. .................. 257/30 |
| 2006/0061915 A1* | 3/2006 | Zhang et al. ........... 360/324.11 |
| 2007/0015293 A1* | 1/2007 | Wang et al. .................... 438/3 |
| 2007/0268632 A1* | 11/2007 | Jogo et al. ............. 360/324.12 |

FOREIGN PATENT DOCUMENTS

| | | | |
|---|---|---|---|
| EP | 1 478 936 | | 8/2003 |
| JP | 2871670 | | 1/1999 |
| JP | 2001006126 A | * | 1/2001 |
| JP | 2001-068760 | | 3/2001 |
| JP | 2002-204004 | | 7/2002 |
| JP | 2004031694 A | * | 1/2004 |
| WO | WO 2004-021372 A1 | | 3/2004 |

OTHER PUBLICATIONS

Stuart S. P. Parkin et al.; "Giant tunneling magnetoresistance at room temperature with MgO (100) tunnel barriers", Nature Materials, vol. 3, 2004, pp. 862-867. Cited in the spec.

K. Tsunekawa et al.; "Effect of capping layer material on tunnel magnetoresistance in CoFeB/MgO/CoFeB magnetic tunnel junctions", manuscripts of Intermag 2005, Session No. HP-8, Apr. 4, 2005. Cited in the spec.

European Search Report dated Aug. 4, 2006.

H. L. Meyerheim, et al., "Geometrical and Compositional Structure at Metal-Oxide Interfaces: MgO on Fe(001)", Physical Review Letters, 2001 The American Physical Society, vol. 87, No. 7, Aug. 13, 2001, pp. 1-4.

* cited by examiner

FIG.4

| | DIFFUSION BARRIER LAYER | TUNNELING RESISTANCE (Ω·μm²) | TMR RATIO (%) | COERCIVITY (A/m) |
|---|---|---|---|---|
| EXPERIMENT 1 | Ta FILM | 94 | 170 | 832 |
| EXPERIMENT 2 | Ru FILM | 92 | 143 | 1017 |
| EXPERIMENT 3 | Ti FILM | 88 | 123 | 1126 |
| EXPERIMENT 4 | Hf FILM | 102 | 147 | 1089 |
| EXPERIMENT 5 | Rh FILM | 105 | 95 | 1233 |
| COMPARATIVE EXPERIMENT 1 | — | 98 | 154 | 2167 |
| COMPARATIVE EXPERIMENT 2 | — | 85 | 82 | 958 |

FIG.10

| | DIFFUSION BARRIER LAYER | TUNNELING RESISTANCE ($\Omega \cdot \mu m^2$) | TMR RATIO (%) | COERCIVITY (A/m) |
|---|---|---|---|---|
| EXPERIMENT 6 | Ru FILM | 89 | 120 | 1029 |
| COMPARATIVE EXPERIMENT 1 | — | 98 | 154 | 2167 |
| COMPARATIVE EXPERIMENT 2 | — | 85 | 82 | 958 |

FERROMAGNETIC TUNNEL JUNCTION, MAGNETIC HEAD USING THE SAME, MAGNETIC RECORDING DEVICE, AND MAGNETIC MEMORY DEVICE

BACKGROUND OF THE INVENTION

1. Field of the Invention

The present invention relates to a ferromagnetic tunnel junction; and a magnetic head, a magnetic recording device, and a magnetic memory device that use the ferromagnetic tunnel junction.

2. Description of the Related Art

Ferromagnetic tunnel junctions including a pair of ferromagnetic layers separated by a tunnel insulating film have been proposed for use as magnetic sensors for magnetic heads and the like. Since these ferromagnetic tunnel junctions are expected to show a very large magnetoresistance change in response to a faint change in magnetic fields, they are promising for use as ultrasensitive magnetic sensors for magnetic heads.

FIGS. 1A and 1B illustrate the principal of such a ferromagnetic tunnel junction 100. Referring to FIGS. 1A and 1B, the ferromagnetic tunnel junction 100 comprises ferromagnetic layers 101 and 103 of NiFe or Co, and a tunnel insulating film 102 of AlOx with a thickness of several nano meters interposed between the ferromagnetic layers 101 and 103. Electrons with an upward spin direction and electrons with a downward spin direction generate a tunneling current flowing through the tunnel insulating film 102 in a direction perpendicular to a principal surface thereof.

FIG. 1A shows a state in which substantially no external magnetic field is present. The ferromagnetic layer 101 is a pinned magnetic layer whose magnetization direction is fixed by an antiferromagnetic layer (not shown) disposed in contact with the lower side of the ferromagnetic layer 101. The ferromagnetic layer 103 is a free magnetic layer whose magnetization direction changes depending on the direction of external magnetic fields. When substantially no external magnetic field is applied, the magnetization of the ferromagnetic layer 103 (herein after referred to as "free magnetic layer 103") is oriented in the same direction of a magnetic easy axis thereof. In this state, the magnetization directions of the ferromagnetic layer 101 (hereinafter referred to as "pinned magnetic layer 101") and the ferromagnetic layer 103 (hereinafter referred to as "free magnetic layer 103") are parallel to each other. In contrast, when an external magnetic field H is applied as shown in FIG. 1B, the magnetization of the free magnetic layer 103 is oriented in the same direction as the external magnetic field H so as to be antiparallel to the magnetization of the pinned magnetic layer 101.

In the ferromagnetic tunnel junction 100 having the configuration as described above, tunneling probability of the tunneling current varies depending on the magnetization state of the pinned magnetic layer 101 and the free magnetic layer 103. Therefore, tunneling resistance R of the ferromagnetic tunnel junction 100 varies due to the external magnetic field H, and is expressed as the following Equation (1):

$$R = Rs + (1/2)\Delta R(1 - \cos\theta) \quad (1)$$

wherein Rs represents the tunneling resistance in a state where the magnetization directions of the pinned magnetic layer 101 and the free magnetic layer 103 are parallel to each other; θ represents the angle formed by the magnetization of the pinned magnetic layer 101 and the magnetization of the free magnetic layer 103; and ΔR, which is always positive, represents the difference in the tunneling resistance between the state where magnetizations of the pinned magnetic layer 101 and the free magnetic layer 103 are parallel to each other and the state where magnetizations of the pinned magnetic layer 101 and the free magnetic layer 103 are antiparallel to each other. Also, the change ratio of tunneling resistance, i.e, the TMR ratio is defined as ΔR/Rs.

According to Equation (1), the tunneling resistance R is minimized when the magnetizations of the pinned magnetic layer 101 and the free magnetic layer 103 are parallel to each other, and is maximized when antiparallel to each other. This change of the tunneling resistance R results from the presence of the electrons with the upward spin direction (up-spin electrons) and the electrons with the downward spin direction (down-spin electrons) in electronic current. Generally, a nonmagnetic body has the same number of up-spin electrons and down-spin electrons, and therefore does not exhibit magnetism as a whole. On the other hand, a ferromagnetic body has different numbers of up-spin electrons and down-spin electrons, and therefore exhibits upward or downward magnetism as a whole.

When an electron tunnels between the pinned magnetic layer 101 and the free magnetic layer 103, the electron retains the spin state before and after the tunneling. This means that when electrons tunnel from the free magnetic layer 103 to the pinned magnetic layer 101, a vacant energy level corresponding to the spin state of the electron is present in the pinned magnetic layer 101. If there is no vacant energy level, the tunneling of electrons does not occur.

The TMR ratio ΔR/Rs is a product of spin polarizability of the source (the free magnetic layer 103) and polarizability of the vacant energy level of the target (pinned magnetic layer 101), and is represented as:

$$\Delta R/Rs = 2P_1 P_2 / (1 - P_1 P_2) \quad (2)$$

wherein $P_1$ represents the spin polarizability of the free magnetic layer 103, and $P_2$ represents the spin polarizability of the vacant energy level of the pinned magnetic layer 101. $P_1$ and $P_2$ are calculated as follows:

$$P_1, P_2 = 2(N\text{up} - N\text{down})/(N\text{up} + N\text{down})$$

wherein Nup represents the number of up-spin electrons or the number of levels for the up-spin electrons, and Ndown represents the number of down-spin electrons or the number of levels for the down-spin electrons.

The spin polarizability $P_1$, $P_2$ generally depends on the type of ferromagnetic materials. If a proper material is chosen, the spin polarizability may reach close to 50%. A magnetic sensor using such a ferromagnetic tunnel junction is therefore expected to have a magnetoresistance ratio of several dozen percent, which is much greater than that of AMR (anisotropic magnetoresistive) and GMR (giant magnetoresistive) magnetic sensors. Accordingly, magnetic heads using ferromagnetic tunnel junctions are considered advantageous for use in super-high magnetic recording and reproduction (see, for example, Patent Document 1).

Recently, a ferromagnetic tunnel junction with a multilayer body of Fe(001)/MgO(001)/Fe(001) has been presented, in which a tunnel insulating film is formed of magnesium oxide and ferromagnetic layers are formed of single-crystal Fe (see Non-Patent Document 1). This multilayer body is epitaxially grown by an epitaxial method. It is reported that this ferromagnetic tunnel junction exhibits a TMR ratio of 200% or higher at room temperature.

According to another study, a ferromagnetic tunnel junction with a multilayer body of CoFe/MgO(001)/CoFe, in which amorphous CoFe is used as a material of ferromagnetic layers in place of single-crystal Fe, exhibits a TMR ratio of 220% at room temperature (see Patent Document 2). It is also reported that a ferromagnetic tunnel junction with ferromagnetic layers formed of amorphous CoFeB in place of amorphous CoFe demonstrates a remarkably high TMR ratio (see Patent Document 3). Since amorphous CoFe films, amorphous CoFeB films, and MgO films can be formed by sputtering, these ferromagnetic tunnel junctions are readily manufacturable using conventional magnetic head manufacturing process.

[Patent Document 1] Japanese Patent No. 2871670

[Non-Patent Document 1] Yuasa et al. "Giant room-temperature magnetoresistance in single-crystal Fe/MgO/Fe magnetic tunnel junctions" Nature Materials vol. 3, pp. 868-871 (2004)

[Non-Patent Document 2] Parkin et al. "Giant tunneling magnetoresistance at room temperature with MgO(100) tunnel barriers" Nature Materials vol. 3, pp. 862-867 (2004)

[Non-Patent Document 3] Tsunekawa et al. "Effect of capping layer material on tunnel magnetoresistance in CoFeB/MgO/CoFeB magnetic tunnel junctions" manuscripts of INTERMAG 2005, session No. HP-08 (Apr. 4, 2005)

However, if the ferromagnetic tunnel junction 100 shown in FIGS. 1A and 1B includes the free magnetic layer 103 of CoFeB, and if a ferromagnetic film of NiFe, CoFe, or the like is formed on the free magnetic layer 103 as disclosed in Non-Patent Document 3, TMR ratio drops significantly due to a heat treatment for improving the quality of the tunnel insulating film 102 compared to the case where such a ferromagnetic film is not present.

Also, in the case where the antiferromagnetic layer of the ferromagnetic tunnel junction 100 is formed of an ordered alloy film, such as a PdPtMt film, the TMR ratio may decrease due to a heat treatment for ordering the antiferromagnetic layer.

SUMMARY OF THE INVENTION

The present invention solves at least one problem described above. According to some aspects of the present invention, there are provided a ferromagnetic tunnel junction that prevents lowering of the TMR ratio due to a heat treatment; and a magnetic head, a magnetic recording device, and a magnetic memory device that use the ferromagnetic tunnel junction.

More specifically, according to an aspect of the present invention, there is provided a ferromagnetic tunnel junction comprising a pinned magnetic layer; a tunnel insulating film formed on the pinned magnetic layer; and a free magnetic multilayer body formed on the tunnel insulating film; wherein the free magnetic multilayer body includes a first free magnetic layer, a diffusion barrier layer, and a second free magnetic layer stacked in this order on the tunnel insulating film, the first free magnetic layer and the second free magnetic layer being ferromagnetically coupled with each other; the first free magnetic layer contains CoFe and at least one additive element selected from the group consisting of B, C, Al, Si, Zr, and P; and the diffusion barrier layer inhibits the additive element contained in the first free magnetic layer from diffusing into the second free magnetic layer.

According to this aspect of the present invention, the diffusion barrier layer is provided between the first free magnetic layer and the second free magnetic layer in the free magnetic multilayer body. The diffusion barrier layer inhibits the additive element contained in the first free magnetic layer from diffusing into the second free magnetic layer due to heat treatments, thereby preventing lowering of TMR ratio of the ferromagnetic tunnel junction due to diffusion of the additive element.

According to another aspect of the present invention, there is provided a ferromagnetic tunnel junction comprising a pinned magnetic layer; a tunnel insulating film formed on the pinned magnetic layer; and a free magnetic multilayer body formed on the tunnel insulating film; wherein the free magnetic multilayer body includes a first free magnetic layer, a second free magnetic layer, and a diffusion barrier layer stacked in this order on the tunnel insulating film, the first free magnetic layer and the second free magnetic layer being ferromagnetically coupled with each other; the first free magnetic layer contains CoFe and at least one additive element selected from the group consisting of B, C, Al, Si, Zr, and P; and the diffusion barrier layer inhibits the additive element contained in the first free magnetic layer from diffusing into the second free magnetic layer.

According to this aspect of the present invention, in the free magnetic multilayer body, the second free magnetic layer is formed on the first free magnetic layer, and the diffusion barrier layer is formed on the second free magnetic layer. Even when the first free magnetic layer is directly in contact with the second free magnetic layer, the diffusion barrier layer formed on the second free magnetic layer inhibits the additive element contained in the first free magnetic layer from diffusing into the second free magnetic layer due to heat treatments. Consequently, the ferromagnetic tunnel junction can prevent lowering of the TMR ratio. Although the mechanism that the diffusion barrier layer formed on the second free magnetic layer inhibits the diffusion is not clear in the study by the inventors of this invention, such inhibition of the diffusion was confirmed in experiments as described below.

Preferably, the second free magnetic layer is made of a material having lower coercivity than the first free magnetic layer. In the case where the second free magnetic layer having lower coercivity than the first free magnetic layer is formed on the first free magnetic layer, the first free magnetic layer and the second free magnetic layer are ferromagnetically exchange-coupled with each other. As a result, sensitivity to external magnetic fields is improved. Moreover, the diffusion barrier layer inhibits the additive element contained in the first free magnetic layer from diffusing into the second free magnetic layer due to heat treatments, so that lowering of the TMR ratio is prevented.

According to a further aspect of the present invention, there is provided a magnetic head comprising either one of the above-described ferromagnetic tunnel junctions. According to still another aspect of the present invention, there is provided a magnetic recording device comprising the above-described magnetic head and a magnetic recording medium.

According to these aspects of the present invention, the magnetic head and the magnetic recording medium have high SNR as they include either one of the above-described ferromagnetic tunnel junctions. Therefore, the magnetic head and the magnetic recording medium can realize high density recording.

According to still another aspect of the present invention, there is provided a magnetic memory device comprising either one of the above-described ferromagnetic tunnel junctions; a writing unit configured to apply a magnetic field to the ferromagnetic tunnel junction so as to orient magnetizations of the first free magnetic layer and the second free magnetic layer into predetermined directions; and a reading unit configured to supply a sense current to the ferromagnetic tunnel junction so as to detect a tunneling resistance.

According to this aspect of the present invention, since the magnetic memory device comprises either one of the above-described ferromagnetic tunnel junctions, the difference between tunneling resistances corresponding to information indicating "0" and information indicating "1" is large. Therefore, the magnetic memory device can accurately read the information.

According to the above-described aspects of the present invention, there are provided a ferromagnetic tunnel junction that inhibits lowering of the TMR ratio due to heat treatments; and a magnetic head, a magnetic recording device, and a magnetic memory device that use the ferromagnetic tunnel junction.

BRIEF DESCRIPTION OF THE DRAWINGS

FIG. 4 is a table showing properties of ferromagnetic tunnel junctions in experiments and comparative experiments according to the first embodiment of the present invention;

FIG. 10 is a table showing properties of ferromagnetic tunnel junctions in an experiment and comparative experiments according to the second embodiment;

DETAILED DESCRIPTION OF THE PREFERRED EMBODIMENT

The following description provides exemplary embodiments of the present invention with reference to accompanying drawings.

First Embodiment

Figure 2:
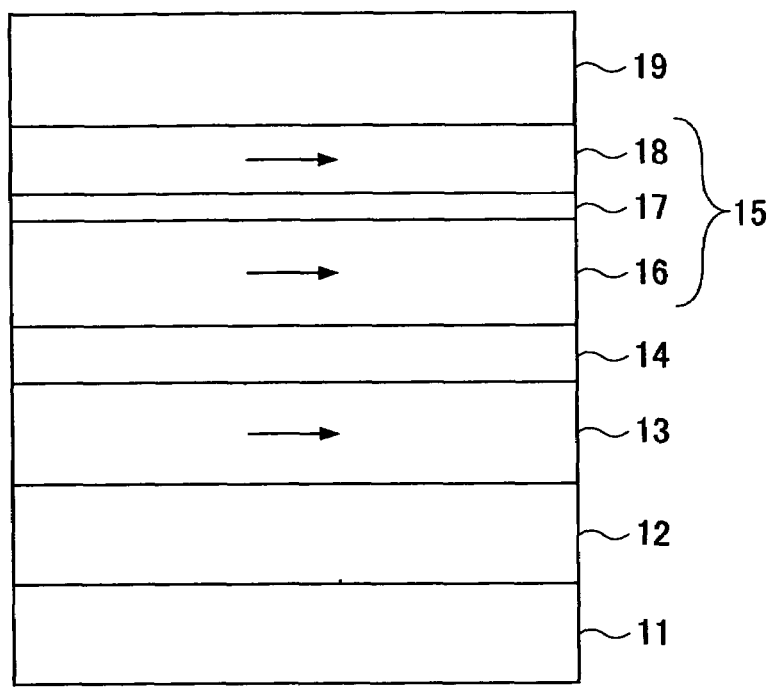
FIG. 2 is a cross-sectional view showing main parts of a ferromagnetic tunnel junction according to a first embodiment of the present invention.

FIG. 2 is a cross-sectional view showing main parts of a ferromagnetic tunnel junction 10 according to a first embodiment of the present invention.

Referring to FIG. 2, the ferromagnetic tunnel junction 10 of the first embodiment includes an under layer 11, an antiferromagnetic layer 12, a pinned magnetic layer 13, a tunnel insulating film 14, a free magnetic multilayer body 15, and a protective film 19, which are stacked in this order. The free magnetic multilayer body 15 includes a first free magnetic layer 16, a diffusion barrier layer 17, and a second free magnetic layer 18, which are stacked in this order from the tunnel insulating film 14 side. The first free magnetic layer 16 and the second free magnetic layer 18 are ferromagnetically coupled with each other. The magnetization directions of the first free magnetic layer 16 and the second free magnetic layer 18 are parallel to each other when no external magnetic field is applied. The magnetization directions of the first free magnetic layer 16 and the second free magnetic layer 18 vary in accordance with the magnetization direction of external magnetic fields. The tunneling resistance changes in accordance with the angle formed by magnetization directions of the first and second free magnetic layers 16 and 18 and the magnetization direction of the pinned magnetic layer 13. The ferromagnetic tunnel junction 10 of the first embodiment has a high TMR ratio as described below in detail, so that the SNR (Signal-to-Noise Ratio) in response to external magnetic fields is improved.

The under layer 11 is disposed on the surface of a lower electrode (not shown), and is formed of a film of Ta, Cu, or Au having a thickness of, e.g., 5 nm-40 nm, or a multilayer body of these elements. The under layer 11 may further includes an NiFe film (containing, e.g., 17 atomic %-25 atomic % of Fe) on its surface. By having such an NiFe film, the antiferromagnetic layer 12 is epitaxially grown on the surface of a (111) crystal plane and a crystal plane crystallographically equivalent to the (111) crystal plane in a crystal growth direction of the NiFe film. This improves crystallization of the antiferromagnetic layer 12. As a result, exchange interaction from the antiferromagnetic layer 12 to the pinned magnetic layer 13 is promoted, thereby increasing stability of the magnetization direction of the pinned magnetic layer 13.

A lower electrode (not shown) may be formed on the lower side of the under layer 11 such that a sense current for detecting the tunneling resistance flows therethrough. Alternatively, the under layer 11 may be configured to have a function of the lower electrode so as to eliminate the need for separately providing the lower electrode.

The antiferromagnetic layer 12 includes an Mn-TM alloy film with a thickness of, e.g., 5 nm-30 nm (preferably, 10 nm-20 nm), in which TM contains at least one of Pt, Pd, Ni, Ir, and Rh). The antiferromagnetic layer 12 goes through a heat treatment after deposition to become an ordered alloy, so that antiferromagnetism emerges. The antiferromagnetic layer 12 generates exchange interaction with the pinned magnetic layer 13 so as to pin the magnetization of the pinned magnetic layer 13 to a predetermined direction.

The pinned magnetic layer 13 includes a film having a thickness of 1-30 nm and formed of a ferromagnetic material containing any one of Co, Ni, and Fe. The magnetization direction of the pinned magnetic layer 13 is pinned to a predetermined direction due to the exchange interaction with the antiferromagnetic layer 12. That is, the magnetization direction of the pinned magnetic layer 13 is not changed by application of an external magnetic field as long as the intensity of the external magnetic field is smaller than the exchange interaction.

CoFe and CoFe alloy may be preferable choices as the ferromagnetic material used for the pinned magnetic layer 13. Preferably, CoFe alloy contains CoFe as the main component, and an additive element M1 for making CoFe amorphous or microcrystalline. Although the additive element M1 may be any element capable of making CoFe amorphous when the pinned magnetic layer 13 is formed by sputtering, the additive element M1 may preferably be at least one element selected from the group consisting of B, C, Al, Si, Zr, and P. Especially, CoFeB is suitable as the CoFe alloy.

By having the pinned magnetic layer 13 of CoFe-M1 in which CoFe is in an amorphous state or a microcrystalline state, the tunnel insulating film 14 remains nearly unaffected by coupling action of the pinned magnetic layer 13 having crystallographic anisotropy. Therefore, the quality of the tunnel insulating film 14 is improved. More specifically, when the tunnel insulating film 14 is in an amorphous state or a microcrystalline state, the composition is homogenized by atomic diffusion. Otherwise when the tunnel insulating film 14 is in a crystalline state, crystalline orientation is promoted in addition to homogenization of the composition.

Especially, in the case where the tunnel insulating film 14 is an MgO film, the MgO film is in a crystalline state, and a (001) face is oriented parallel to a film face. The orientation of the (001) face is oriented on its own without being influenced by crystallographic effects of the surface of the pinned magnetic layer 13 in a heat treatment. Thus the MgO film has a preferable crystalline orientation, resulting in increasing the TMR ratio.

The amorphous state and the microcrystalline state of the pinned magnetic layer 13 referred to herein indicate states in which a sharp diffraction line is not observed in a diffraction pattern of the pinned magnetic layer 13 measured by an X-ray diffraction method such as an X-ray diffract meter (θ-2θ) method. In other words, the amorphous state and the microcrystalline state indicate states where a diffraction line having a broad diffraction pattern or no diffraction line is observed. Effects due to crystallographic anisotropy referred to herein indicate a phenomenon, for example, when the pinned magnetic layer 13 is a polycrystalline substance and the tunnel insulating film 14 is an MgO film, crystals consisting of the polycrystalline substance act on the MgO film to inhibit crystalline orientation of the MgO film.

The pinned magnetic layer 13 may be a single layer body including the single films formed of the ferromagnetic material described above, or may be a multilayer body including two or more of the film formed of the ferromagnetic materials described above. The layers of this multilayer body may be formed of materials having the same combination of elements but with different elemental proportions, or may be formed of materials having different combinations of elements. The pinned magnetic layer 13 may be substituted for by a pinned magnetic multilayer body 21 shown in FIG. 3.

Figure 3:
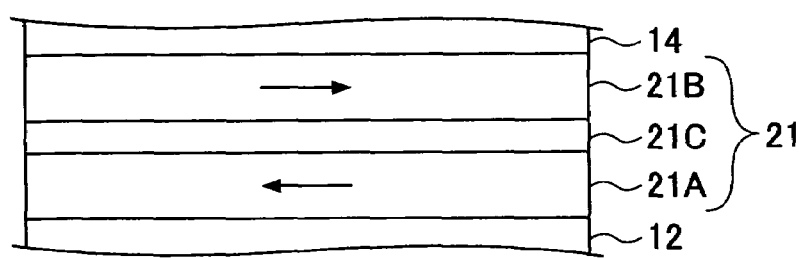
FIG. 3 is a cross-sectional view showing main parts of a ferromagnetic tunnel junction including a pinned magnetic multilayer body.

FIG. 3 is a cross-sectional view illustrating main parts of a ferromagnetic tunnel junction 20 including the pinned magnetic multilayer body 21. FIG. 3 shows only the pinned magnetic multilayer body 21 and layers 12 and 14 directly below and above the pinned magnetic multilayer body 21, and does not show other layers as they are the same as the layers shown in FIG. 2.

Referring to FIG. 3, the pinned magnetic multilayer body 21 includes a first pinned magnetic layer 21A, a nonmagnetic coupling layer 21C, and a second pinned magnetic layer 21B, which are stacked in this order from the antiferromagnetic layer 12 side. The pinned magnetic multilayer body 21 has a so-called multilayer ferri structure in which the first pinned magnetic layer 21A and the second pinned magnetic layer 21B are exchange-coupled with each other through the nonmagnetic coupling layer 21C. The first pinned magnetic layer 21A and the second pinned magnetic layer 21B may be formed of the same material as the pinned magnetic layer 13 shown in FIG. 2. Especially, CoFe and CoFe alloy are suitable as the material of the second pinned magnetic layer 21B in terms of improving the quality of the tunnel insulating film 14 in the above-described heat treatment. The thickness of the first pinned magnetic layer 21A and the second pinned magnetic layer 21B is set within the same thickness range as the pinned magnetic layer 13.

The nonmagnetic coupling layer 21C has a thickness that allows the antiferromagnetic coupling of the first pinned magnetic layer 21A and the second pinned magnetic layer 21B, ranging from 0.4 nm to 1.5 nm (preferably, from 0.4 nm to 0.9 nm). The nonmagnetic coupling layer 21C is formed of an antimagnetic material such as Ru, Rh, Ir, Ru series alloy, Rh series alloy, and Ir series alloy. The Ru series alloy is preferably formed of a material containing Ru and at least one of Co, Cr, Fe, Ni, and Mn. The magnetization of the first pinned magnetic layer 21A and the magnetization of the second pinned magnetic layer 21B are antiparallel to each other, and therefore the net intensity of a magnetic field emanating from the pinned magnetic multilayer body 21 is lowered. Accordingly, the magnetization direction of the free magnetic multilayer body 15 shown in FIG. 2 is prevented from being changed by the emanating magnetic field. Therefore, the magnetization of the free magnetic multilayer body 15 accurately responds to a magnetic field emanating from a magnetic recording medium, resulting in improving detection accuracy of the ferromagnetic tunnel junction 10. The magnetization of the free magnetic multilayer body 15 referred to herein indicates magnetization of both the first free magnetic layer 16 and the second free magnetic layer 18 of FIG. 2.

Referring back to FIG. 2, the tunnel insulating film 14 is formed of any one of oxides selected from the group consisting of Mg, Al, Ti, and Zr. Examples of the oxides include MgO, AlOx, TiOx, and ZrOx, in which x represents that the composition may not be exactly the same for the compound of each material. It is preferable that the tunnel insulating film 14 be crystalline MgO, and that a (001) face of MgO be substantially parallel to the film face.

Alternatively, the tunnel insulating film 14 may be formed of any one of nitrides or oxynitrides selected from the group consisting of Al, Ti, and Zr. Examples of the nitrides include AlN, TiN, and ZrN.

If the tunnel insulating film 14 is formed of one of the above materials excluding MgO, the thickness is preferably set within a range from 0.5 nm to 2.0 nm (more preferably, from 0.7 nm to 1.2 nm). If otherwise the tunnel insulating film 14 is formed of MgO, the thickness is preferably set within a range from 0.7 nm to 2.0 nm.

As mentioned previously, the free magnetic multilayer body 15 includes the first free magnetic layer 16, the diffusion barrier layer 17, and the second free magnetic layer 18.

The first free magnetic layer 16 is formed of a ferromagnetic material containing CoFe and an additive element M2. The additive element M2 is at least one element selected from the group consisting of B, C, Si, Zr, and P. The additive element M2 facilitates making CoFe amorphous or microcrystalline when the first free magnetic layer 16 is formed. By making the first free magnetic layer 16 amorphous or microcrystalline, the tunnel insulating film 14 formed under the first free magnetic layer 16 remains nearly unaffected by crystallographic anisotropy of the first free magnetic layer 16. Therefore, the quality of the tunnel insulating film 14 is improved by a heat treatment. More specifically, when the tunnel insulating film 14 is in an amorphous state or microcrystalline state, the composition is homogenized by atomic diffusion. Otherwise when the tunnel insulating film 14 is in a crystalline state, crystalline orientation is promoted in addition to homogenization of the composition. Consequently, the TMR ratio is increased.

Especially, when the tunnel insulating film 14 is an MgO film, the (001) face is oriented on its own by the heat treatment without being influence by crystallographic effects of the first free magnetic layer 16. Thus the MgO film has a preferable crystalline orientation, resulting in increasing the TMR ratio. The amorphous state or the microcrystalline state of the first free magnetic layer 16 referred to herein indicate the same state as in the case of the pinned magnetic layer 13.

The first free magnetic layer 16 preferably contains 10 atomic %-25 atomic % of the additive element M2 so as to make the first free magnetic layer 16 amorphous more easily.

The diffusion barrier layer 17 is formed of any one of elements selected from the group consisting of Ta, Ti, Ru, and Hf. The diffusion barrier layer 17 is interposed between the first free magnetic layer 16 and the second free magnetic layer 18 so as to inhibit diffusion of the additive element M2 of the first free magnetic layer 16 into the second free magnetic layer 18 during various heat treatments in a manufacturing process. Examples of the heat treatments include the heat treatment for ordering the antiferromagnetic layer 12, and the heat treatment for improving the quality of the tunnel insulating film 14.

The diffusion barrier layer 17 can also inhibit diffusion of Co of the first free magnetic layer 16 and diffusion of Ni of the second free magnetic layer 18. The material of the diffusion barrier layer 17 is determined based on experiments by the inventors of this invention, which are described below in detail.

The diffusion barrier layer 17 preferably has a thickness ranging from 0.1 nm-0.5 nm. With the thickness in this range, the diffusion barrier layer 17 can prevent the additive element M2 of the first free magnetic layer 16 from diffusing into the second free magnetic layer 18. Meanwhile, the diffusion barrier layer 17 ferromagnetically exchange-couples the first free magnetic layer 16 with the second free magnetic layer 18 so as to make the magnetizations of the first free magnetic layer 16 and the second free magnetic layer 18 parallel to each other.

The second free magnetic layer 18 is formed of a ferromagnetic material containing any one of Co, Ni, and Fe. Preferably, the second free magnetic layer 18 is formed of a ferromagnetic material having a lower coercivity than the first free magnetic layer 16. The ferromagnetic material suitable for the second free magnetic layer 18 may be a material containing NiFe. Examples of the material containing NiFe may include NiFe and CoNiFe having fcc structure. These ferromagnetic materials may contain B, Ti, Zr, Hf, etc., with a content lower than the additive element M2 of the first free magnetic layer 16.

In this way, by ferromagnetically coupling the first free magnetic layer 16 with the second free magnetic layer 18 having a lower coercivity than the first free magnetic layer 16, sensitivity to external magnetic fields is improved. This is because, in general, ferromagnetic films having lower coercivity are more responsive to a direction of external magnetic fields. Since the second free magnetic layer 18 has a lower coercivity than the first free magnetic layer 16, the magnetization of the second free magnetic layer 18 responds application of an external magnetic field more quickly than the first free magnetic layer 16. Then, the direction of the magnetization of the first free magnetic layer 16, which is ferromagnetically exchange-coupled with the magnetization of the second free magnetic layer 18, is changed by being pulled toward the magnetization direction of the second free magnetic layer 18. Thus, magnetization of the first free magnetic layer 16, which affects the TMR ratio, can respond to lower magnetization intensity compared to the case where the second free magnetic layer 18 is not provided. As a result, sensitivity of the ferromagnetic tunnel junction 10 to external magnetic fields is improved.

The protective film 19 has a thickness of, e.g., 5 nm-30 nm, and is formed of nonmagnetic metal film of Au, Ta, Al, W, or Ru, or a multilayer body of these materials. The multilayer body of the protective film 19 may include a Ta film and an Ru film formed on the second free magnetic layer in this order or in the opposite order. This protective film 19 prevents oxidization of the layers under the protective film 19 during heat treatments.

According to this embodiment, in the ferromagnetic tunnel junction 10, the free magnetic multilayer body 15 includes the diffusion barrier layer 17 interposed between the first free magnetic layer 16 and the second free magnetic layer 18. The diffusion barrier layer 17 inhibits diffusion of the additive element M2 of the first free magnetic layer 16 into the second free magnetic layer 18, thereby preventing the lowering of the TMR ratio of the ferromagnetic tunnel junction 10 due to the diffusion of the additive element M2.

The first free magnetic layer 16 and the second free magnetic layer 18 are ferromagnetically exchanged-coupled with each other. Since the second free magnetic layer 18 has a ferromagnetic material with a lower coercivity than the first free magnetic layer 16, the magnetization of the second free magnetic layer 18 responds an external magnetic field, and then the magnetization of the first free magnetic layer 16 responds. Accordingly, the sensitivity of the ferromagnetic tunnel junction 10 to external magnetic fields is improved compared to the case where only the first free magnetic layer 16 is provided.

The following describes a method for manufacturing the ferromagnetic tunnel junction 10 of this embodiment of the present invention with reference to FIG. 2. First, the under layer 11, the antiferromagnetic layer 12, and the pinned magnetic layer 13 are sequentially formed on a silicon substrate (not shown), which is covered with a natural oxide film, using targets formed of the above-described materials in an Ar atmosphere by a DC magnetron sputtering apparatus. The lower electrode formed of a low resistance material, such as Au, may be provided between the silicon substrate and the under layer 11. Alternatively, the under layer 11 may be formed to have a function of the lower electrode.

Next, the tunnel insulating film 14 is formed on the surface of the pinned magnetic layer 13 using a target formed of the materials of the tunnel insulating film 14 in an Ar gas atmosphere by an RF magnetron sputtering apparatus. In the case where the tunnel insulating film 14 is an oxide, oxygen gas may be mixed in the Ar gas atmosphere. In the case where the tunnel insulating film 14 is a nitride, nitrogen gas may be mixed in the Ar gas atmosphere. Further, in the case where the tunnel insulating film 14 is an oxynitride, oxygen gas and nitrogen gas may be mixed in the Ar gas atmosphere.

There is another method for forming the tunnel insulating film 14 as described below. A metal film is formed from using a target formed of the elements of the tunnel insulating film 14 by a DC magnetron sputtering apparatus. Then, the metal film is subjected to an oxidizing, nitriding, or oxynitriding treatment. For oxidizing, nitriding, or oxynitriding the metal film, the metal film may be exposed to oxygen gas, nitrogen gas, or mixed gas of oxygen gas and nitrogen gas. Otherwise, the metal film may be subjected to a plasma treatment in an Ar gas atmosphere containing these gases.

There is a still another method for forming the tunnel insulating film 14 as described below. The tunnel insulating film 14 is formed using a target formed of metal elements of the tunnel insulating film 14 by a DC magnetron sputtering apparatus in an atmosphere of oxygen gas, nitrogen gas, or mixed gas of oxygen gas and nitrogen gas.

Then, the first free magnetic layer 16, the diffusion barrier layer 17, the second free magnetic layer 18, and the protective film 19 are sequentially formed on the surface of the tunnel insulating film 14 using a target formed of the above-described material again by the DC magnetron sputtering apparatus.

Then, a heat treatment for ordering the antiferromagnetic layer 12 and a heat treatment for forming the magnetic easy axes of the first free magnetic layer 16 and the second free magnetic layer 18 are carried out by applying a magnetic field to the resulting product in a predetermined direction. In the heat treatment for ordering the antiferromagnetic layer 12, a magnetic field is applied in a predetermined direction in a vacuum atmosphere, and the temperature is set to about 280° C. With this treatment, the antiferromagnetic layer 12 is ordered, so that the magnetization direction of the pinned magnetic layer 13 is pinned. Then, in the heat treatment for forming or forming again the magnetic easy axes of the first free magnetic layer 16 and the second free magnetic layer 18, a magnetic field is applied in a predetermined direction, e.g., a direction orthogonal to the magnetization direction in the heat treatment for ordering the antiferromagnetic layer 12, and the temperature is set to about 230° C. With this treatment, the magnetic easy axes of the first free magnetic layer 16 and the second free magnetic layer 18 are formed.

A heat treatment for improving the quality of the tunnel insulating film 14 may also be carried out. For example, in the case where the tunnel insulating film 14 is formed of a MgO film, the heat treatment is performed within a temperature range from 250° C. to 400° C., preferably from 350° C. to 400° C. Thus, the orientation of the (001) face is improved, thereby increasing the TMR ratio. Also in the case where the tunnel insulating film 14 is formed of other materials, the heat treatment within a temperature range from 250° C. to 400° C. is expected to improve the quality of the tunnel insulating film 14 and the TMR ratio. Concerns of adverse effects due to the heat treatments at such high temperatures are eliminated. This is because the diffusion barrier layer 17 is formed between the first free magnetic layer 16 and the second free magnetic layer 18 in the ferromagnetic tunnel junction 10 of the first embodiment, and the diffusion barrier layer 17 inhibits the diffusion of the additive element M2 of the first free magnetic layer 16 into the second free magnetic layer 18, thereby preventing the lowering of the TMR ratio due to the diffusion.

The heat treatment for ordering the antiferromagnetic layer 12, the heat treatment for forming the magnetic easy axes, and the heat treatment for improving the quality of the tunnel insulating film 14 may be performed at once.

Then, although not shown, a product resulting from the above-described process is patterned in a predetermined shape, and then covered with an insulating film formed of an aluminum oxide film or silicon dioxide film. A part of the insulating film is removed to expose the protective film 19, and the upper electrode is provided on the surface of the exposed protective film 19. With these processes, the ferromagnetic tunnel junction 10 is fabricated.

According to this manufacturing method, performance degradation of the ferromagnetic tunnel junction 10 due to the diffusion of the additive element of the first free magnetic layer 16 is prevented by providing the diffusion barrier layer 17. Therefore, the heat treatments can be performed at higher temperatures compared to the case where the diffusion barrier layer 17 is not provided. Accordingly, the quality of the tunnel insulating film 14 is improved. Moreover, since the heat treatments can be performed at high temperatures, the time taken for the heat treatments can be reduced, resulting in improving productivity.

In place of the DC magnetron sputtering apparatus, other DC apparatuses or RF sputtering apparatuses may be used. Also, a CVD apparatus may be used if desired.

The following describes Experiments 1-5 according to the first embodiment. Ferromagnetic tunnel junctions of Experiments 1-5 have the configuration shown in FIG. 2, wherein the pinned magnetic layer 13 is substituted for by the pinned magnetic multilayer body 21 shown in FIG. 3. In Experiments 1-5, various materials are used to form the diffusion barrier layer 17 of the free magnetic multilayer body 15.

[Experiment 1]

A ferromagnetic tunnel junction of Experiment 1 was fabricated in the following manner. An under layer 11 through a protective film 19 were formed on a silicon substrate covered with a natural oxide film, each layer having composition and thickness as described below. The layers excluding the tunnel insulating film 14 formed of a MgO were formed using sputter targets made of corresponding materials of the layers by a DC magnetron sputtering apparatus in an Ar atmosphere (pressure: 30 mPa). The MgO film was formed using a sputter target made of MgO by an RF sputtering apparatus in an Ar atmosphere (pressure: 80 mPa).

Then, a heat treatment for promoting the orientation of a (001) face of the MgO film and for giving antiferromagnetism to the antiferromagnetic layer 12 was performed. The heat treatment was performed at a heating temperature of 350° C. for two hours with application of a magnetic filed of 1185 kA/m (15 kOe).

Then, the resulting product went through a grinding process using ion milling to obtain a columnar product with a diameter of 0.5 µm.

The resulting product was covered with a silicon dioxide film by using an RF sputtering apparatus. Then a part of the silicon oxide film was removed by dry etching to expose the protective film 19. Then an upper electrode formed of an Au film was provided to be in contact with the protective film 19. In the below description, the value in parenthesis represents the thickness of the layer. The same applies to the following Experiments and Comparative Experiments and to multilayer bodies formed for analysis purpose. Also, the layers are separated by a symbol "/". The layer at the left side of "/" is the layer formed at the lower side. A Ta film forming the under layer 11 is used as a lower electrode.

Under layer 11: Ta (50 nm)
Antiferromagnetic layer 12: PtMn (15 nm)
First pinned magnetic layer 21A: $Co_{74}Fe_{26}$ (3 nm)
Nonmagnetic coupling layer 21C: Ru (0.8 nm)
Second pinned magnetic layer 21B: $Co_{60}Fe_{20}B_{20}$ (3 nm)
Tunnel insulating film 14: MgO (2.0 nm)
Free magnetic multilayer body 15
   First free magnetic layer 16: $Co_{60}Fe_{20}B_{20}$ (3 nm)
   Diffusion barrier layer 17: Ta (0.5 nm)
   Second free magnetic layer 18: $Ni_{80}Fe_{20}$ (3 nm)
Protective film 19: Ta (5 nm)/Ru (10 nm)
[Experiments 2-5]

Ferromagnetic tunnel junctions of Experiments 2-5 are the same as the ferromagnetic tunnel junction of Experiment 1 except that the diffusion barrier layers 17 of Experiments 2-5 were formed of an Ru film, a Ti film, an Hf film, and an Rh film, respectively, in place of the Ta film. The thickness of each layer was 0.5 nm.

For comparison, ferromagnetic tunnel junctions of Comparative Experiments 1 and 2 were produced, which are not embodiments of the present invention.

COMPARATIVE EXAMPLE 1

The ferromagnetic tunnel junction of Comparative Experiment 1 is the same as the ferromagnetic tunnel junction of Experiment 1 except that the free magnetic multilayer body 15 does not includes the diffusion barrier layer 17 and the second free magnetic layer 18, but includes the first free magnetic layer 16 of $Co_{60}Fe_{20}B_{20}$ (3 nm).

COMPARATIVE EXAMPLE 2

The ferromagnetic tunnel junction of Comparative Experiment 2 is the same as the ferromagnetic tunnel junction of Experiment 1 except that the free magnetic multilayer body 15 does not include the diffusion barrier layer 17, but includes the first free magnetic layer 16 and the second free magnetic layer 18. More specifically, the free magnetic multilayer body 15 of Comparative Experiment 2 has the following configuration.

Free magnetic multilayer body 15
First free magnetic layer 16: $Co_{60}Fe_{20}B_{20}$ (3 nm)
Second free magnetic layer 18: $Ni_{80}Fe_{20}$ (3 nm)

FIG. 4 is a table showing properties of ferromagnetic tunnel junctions in Experiments 1-5 and Comparative Experiments 1-2.

Referring to FIG. 4, the ferromagnetic tunnel junction of Comparative Experiment 1 has a TMR ratio as high as 154%. It is assumed that the second free magnetic layer 18 is not provided in Comparative Experiment 1, and therefore a drop of TMR ratio due to the heat treatment is not caused. In contrast, TMR ratio of Comparative Experiment 2 is as low as 82%. The cause of lowering the TMR ratio is due to the fact that the second free magnetic layer 18 formed of an $Ni_{80}Fe_{20}$ film is provided in contact with the first free magnetic layer 16 formed of a $Co_{60}Fe_{20}B$ film, and B contained in the $Co_{60}Fe_{20}B$ film is diffused into the $Ni_{60}Fe_{20}$ film (as described later in detail with reference to a multilayer body 3 shown in FIG. 8).

On the other hand, in Experiments 1-5, since the ferromagnetic tunnel junctions include the diffusion barrier layers 17 formed of the Ta film, the Ru film, the Ti film, the Hf film, and the Rh film, respectively, between the first free magnetic layers 16 and the second free magnetic layers 18, TMR ratios are higher compared to Comparative Experiment 2. That is, a significant reduction of TMR ratio as in Comparative Experiment 2 is prevented by providing the diffusion barrier layer 17.

Especially, the ferromagnetic tunnel junctions of Experiments 1-4 exhibit TMR ratios equivalent to or higher than that of Comparative Experiment 1 by having the diffusion barrier layers 17 formed of the Ta film, the Ru film, the Ti film, and the Hf film, respectively. This fact means that diffusion barrier layers 17 substantially prevent the lowering of TMR ratio due to heat treatments.

Moreover, coercivities of Experiments 1-5 are lower than that of Comparative Experiment 1. That is, in Experiments 1-5, external magnetic fields having low intensity, which the ferromagnetic tunnel junction of Comparative Experiment 1 is not capable of responding to, can change the magnetization direction, resulting in changing the TMR ratio. Accordingly, the ferromagnetic tunnel junctions of Experiments 1-5 are more sensitive to application of external magnetic fields.

Figure 5:
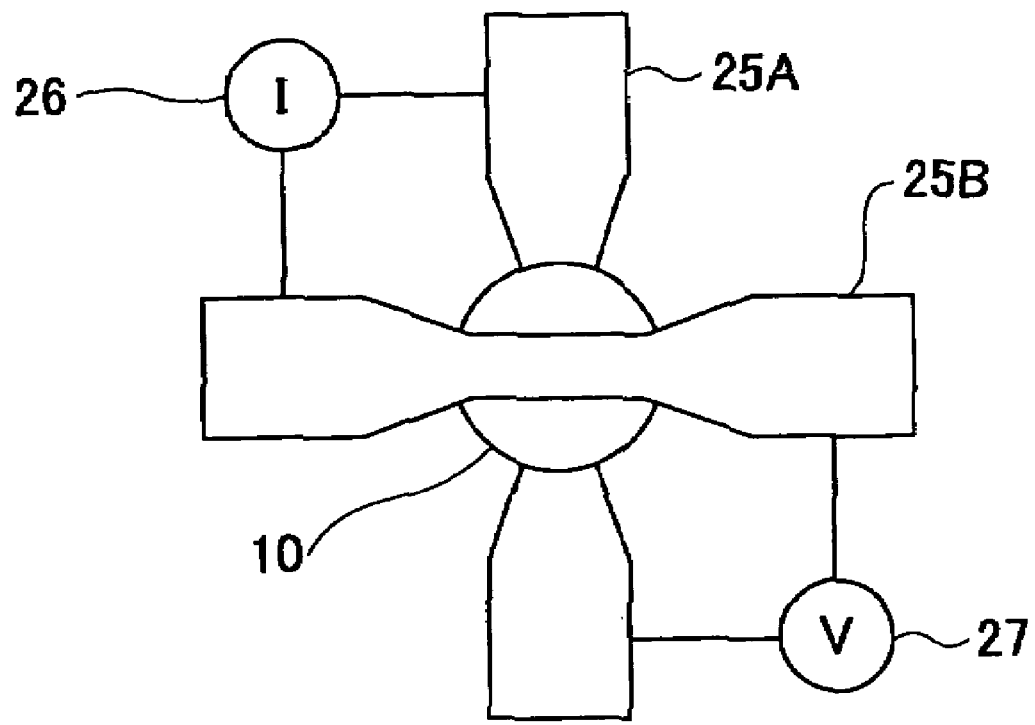
FIG. 5 is a diagram for illustrating a method for measuring the TMR ratio.

In these experiments, the following method was used for measuring the TMR ratio. FIG. 5 illustrates a method for measuring the TMR ratio. With reference to FIG. 5, a lower electrode 25A and an upper electrode 25B were formed so as to interpose the ferromagnetic tunnel junction 10 therebetween. The lower electrode 25A was electrically connected to the under layer 11 shown in FIG. 2, and the upper electrode 25B was electrically connected to the protective film 19. A direct current source 26 was connected between the lower electrode 25A and the upper electrode 25B so as to flow a sense current of 0.1 mA in a direction perpendicular to the film face of the ferromagnetic tunnel junction 10. A magnetic field was applied parallel to a magnetization direction of the $Co_{60}Fe_{20}B_{20}$ film of the second pinned magnetic layer 21B, and the intensity of the magnetic field was changed within a range from −79 kA/m to 79 kA/m. In this condition, variation of voltage between the lower electrode 25A and the upper electrode 25B was measured by a digital volt meter 27. Resistance calculated based on the measured voltage value was used as tunneling resistance. The TMR ratio was represented as ΔR/Rs, wherein Rs represents a tunneling resistance at the time when the magnetizations of the second pinned magnetic layer 21B and the first free magnetic layer 16 became parallel to each other; and ΔR represents the difference with a tunneling resistance at the time when they become antiparallel to each other.

Tunneling resistance per 1 $\mu m^2$ was calculated based on the product of the tunneling resistance Rs and a cross-sectional area A ($\mu m^2$) parallel to the film face of the ferromagnetic tunnel junction 10. As shown in FIG. 4, the tunneling resistances of Experiments 1-5 and Comparative Experiments 1-2 were at the same level, and no tunneling resistance was very small. It can be seen from this result that there was no defect such as a short circuit between the upper electrode and the lower electrode, and the tunneling resistance was correctly measured. The coercivity is calculated based on a magnetic field that makes the difference of tunneling resistances ΔR 50%.

Then, to examine the effect of the diffusion barrier layer 17 of the ferromagnetic tunnel junction 10 of the first embodiment, the following three multilayer bodies 1-3 were fabricated in the same conditions as in the above-described Experiments and Comparative Experiments. Compositional distribution of the multilayer bodies 1-3 was examined by Auger Electron Spectroscopy.

[Multilayer Body 1]

The multilayer body 1 includes an under layer through a protective film shown below, which are stacked on a silicon substrate. A tunnel insulating film and a free magnetic multilayer body of the multilayer body 1 have substantially the same configurations as those of Experiment 1.

Under layer: Ta (50 nm)
Tunnel insulating film: MgO (1.5 nm)
Free magnetic multilayer body
  First free magnetic layer: $Co_{60}Fe_{20}B_{20}$ (3 nm)
  Diffusion barrier layer: Ta (0.5 nm)
  Second free magnetic layer: $Ni_{80}Fe_{20}$ (3 nm)
Protective film: Ru (10 nm)/Ta (5 nm)

[Multilayer Body 2]

The multilayer body 2 has the same configuration except that the diffusion barrier layer is formed of an Ru film (0.5 nm). A tunnel insulating film and a free magnetic multilayer body of the multilayer body 2 have substantially the same configurations as those of Experiment 2.

[Multilayer Body 3]

The multilayer body 3 includes an under layer through a protective film as shown below, which are stacked on a silicon substrate. The multilayer body 3 does not include a diffusion barrier layer. A tunnel insulating film and a free magnetic multilayer body of the multilayer body 3 have substantially the same configurations as those of Comparative Experiment 2

Under layer: Ta (50 nm)
Tunnel insulating film: MgO (1.5 nm)
Free magnetic multilayer body
    First free magnetic layer: $Co_{60}Fe_{20}B_{20}$ (3 nm)
    Second free magnetic layer: $Ni_{80}Fe_{20}$ (3 nm)
Protective film: Ta (5 nm)

Figure 6:
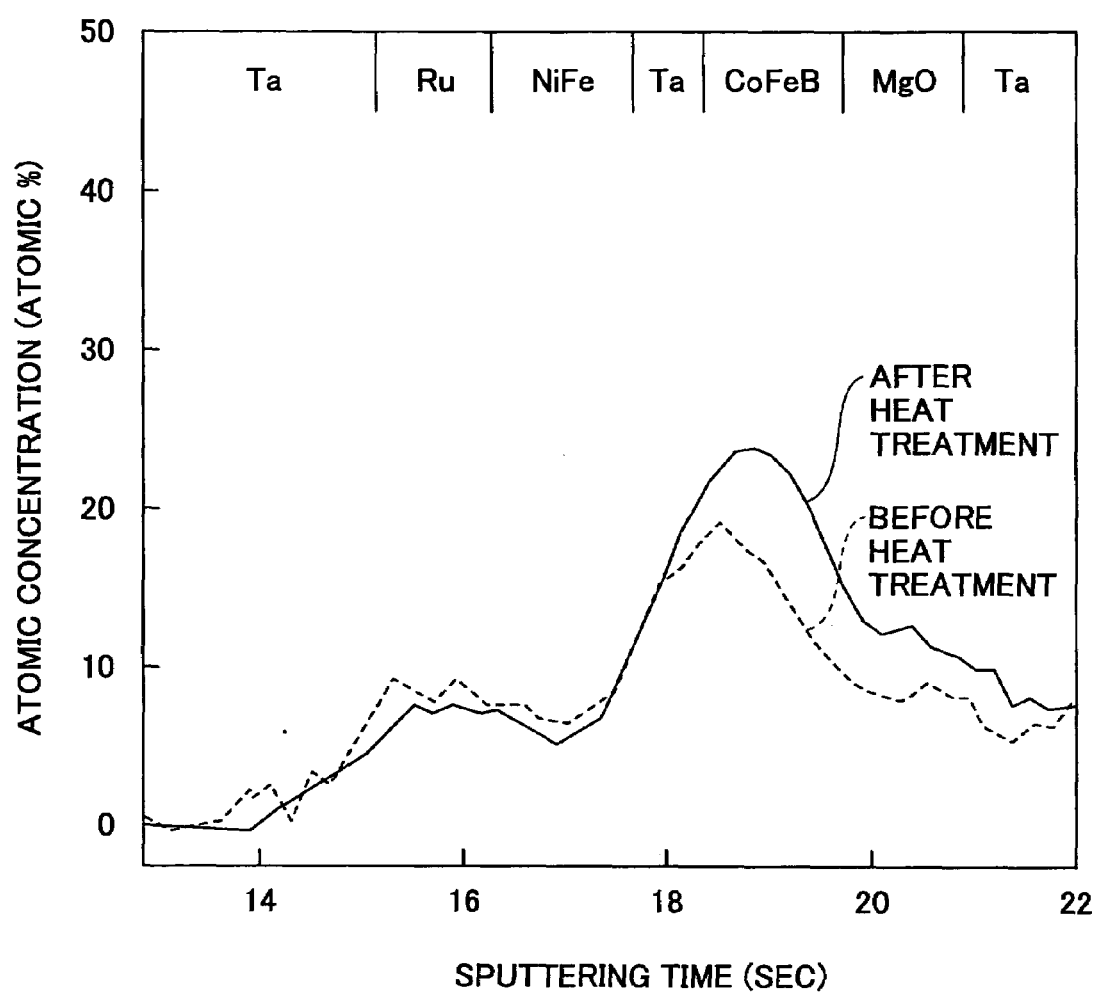
FIG. 6 is a graph showing B concentration profiles of a multilayer body in a depth direction before and after a heat treatment.
Figure 7:
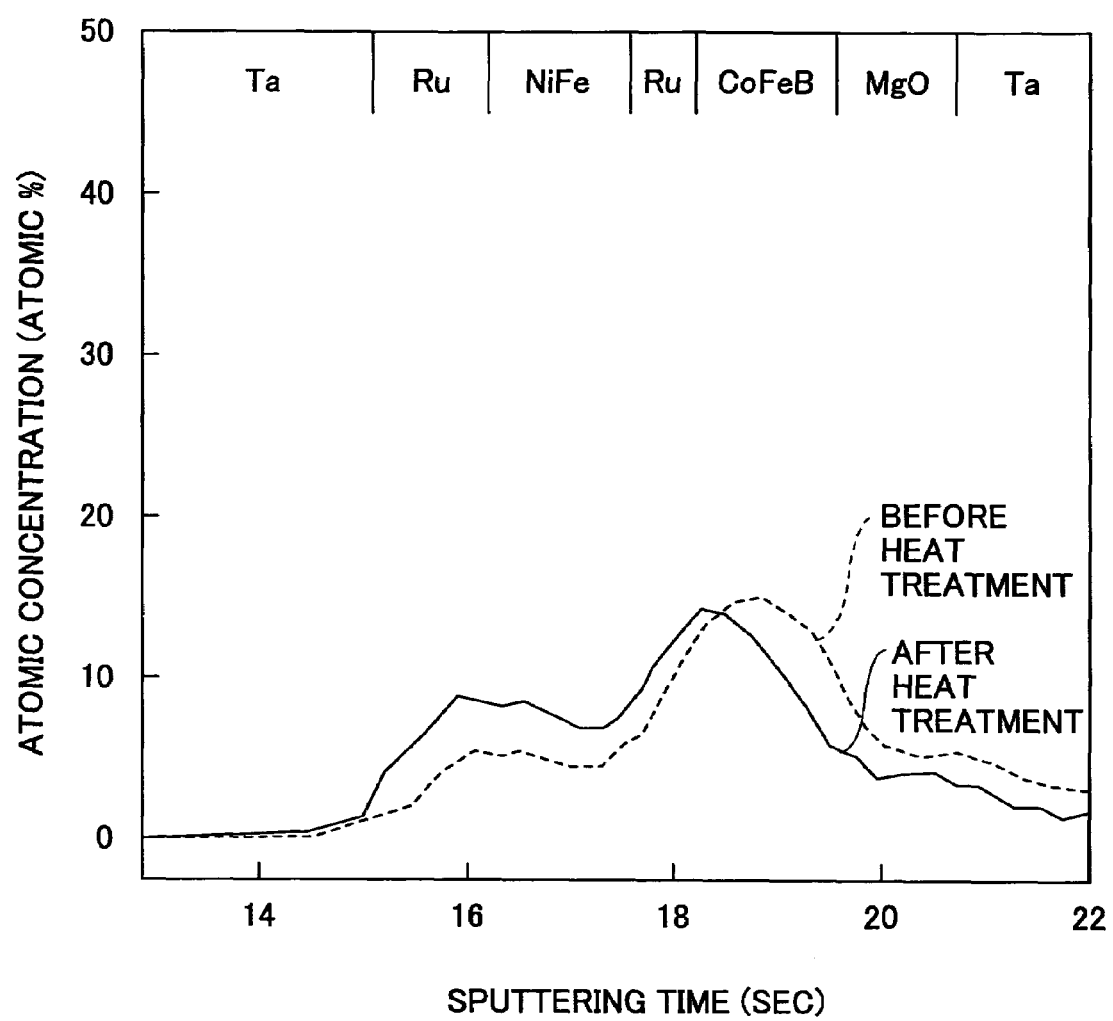
FIG. 7 is a graph showing B concentration profiles of another multilayer body in a depth direction before and after a heat treatment.
Figure 8:
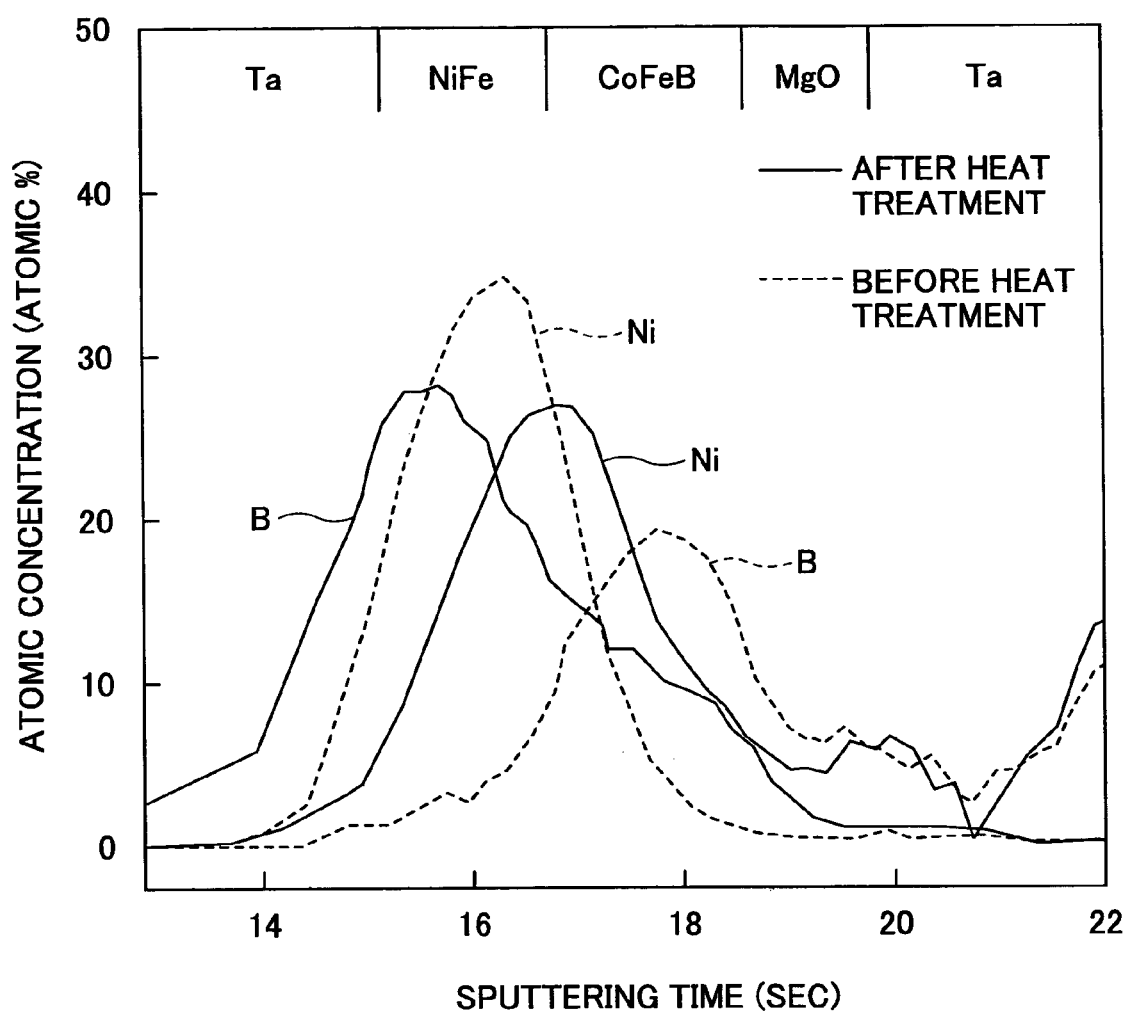
FIG. 8 is a graph showing B and Ni concentration profiles of still another multilayer body in a depth direction before and after a heat treatment.

FIGS. 6 and 7 show B concentration profiles of the multilayer bodies 1 and 2, respectively, in a depth direction before and after a heat treatment. FIG. 8 shows B concentration profiles of the multilayer body 3 in a depth direction before and after a heat treatment. In FIGS. 6-8, a concentration profile before the heat treatment is indicated by a dashed line, and a concentration profile after the heat treatment is indicated by a solid line. The vertical axis represents atomic concentration, and the horizontal axis represents time taken for sputtering for removing materials constituting the corresponding multilayer body from the surface of the multilayer body. The sputtering time corresponds to a depth from the surface of the multilayer body. Positions of the layers corresponding to the sputtering time are shown at the upper part of graphs shown in FIGS. 6-8. The same applies to a graph shown in FIG. 11 described below.

Referring to FIG. 6, in the multilayer body 1, the peak position of the concentration of B contained in the $Co_{60}Fe_{20}B_{20}$ film does not change significantly before and after the heat treatment. From this fact, it can be seen that the Ta film covering the $Co_{60}Fe_{20}B_{20}$ film prevents B contained in the $Co_{60}Fe_{20}B_{20}$ film from diffusing into the $Ni_{80}Fe_{20}$ film.

Referring to FIG. 7, in the multilayer body 2, although the peak of the concentration of B contained in the $Co_{60}Fe_{20}B_{20}$ film after the heat treatment is slightly displaced toward the Ru film, the peak is still located within the $Co_{60}Fe_{20}B_{20}$ film. Therefore, no significant B diffusion occurs. From this fact, it can be seen that the Ru film covering the $Co_{60}Fe_{20}B_{20}$ film prevents B contained in the $Co_{60}Fe_{20}B_{20}$ film from diffusing into the $Ni_{80}Fe_{20}$ film.

Referring to FIG. 8, in the multilayer body 3, the peak of the concentration of B contained in the $Co_{60}Fe_{20}B_{20}$ film is moved into the $Ni_{80}Fe_{20}$ film after the heat treatment. Also, the peak of the concentration of Ni contained in the $Ni_{80}Fe_{20}$ film is moved near the boundary between the $Ni_{80}Fe_{20}$ film and the $Co_{60}Fe_{20}B_{20}$ film after the heat treatment. From these facts, it can be seen that when the diffusion barrier layer is not provided, the composition of the $Co_{60}Fe_{20}B_{20}$ film and the $Ni_{80}Fe_{20}$ film is changed due to the diffusion of B and Ni, resulting in a significant reduction of TMR ratio as shown in Comparative Experiment 2.

From these results and the fact that the TMR ratios of Experiments 1 and 2 corresponding to the multilayer bodies 1 and 2 are substantially the same as that of Comparative Experiment 1, it can be understood that the diffusion barrier layer prevents the diffusion of B, thereby preventing the drop of TMR ratio.

In Auger Electron Spectroscopy, a SAM 670 (Ulvac-phi, Inc.) was used. Ar ions were accelerated at 2 keV in sputtering of the multilayer bodies.

Second Embodiment

Figure 9:
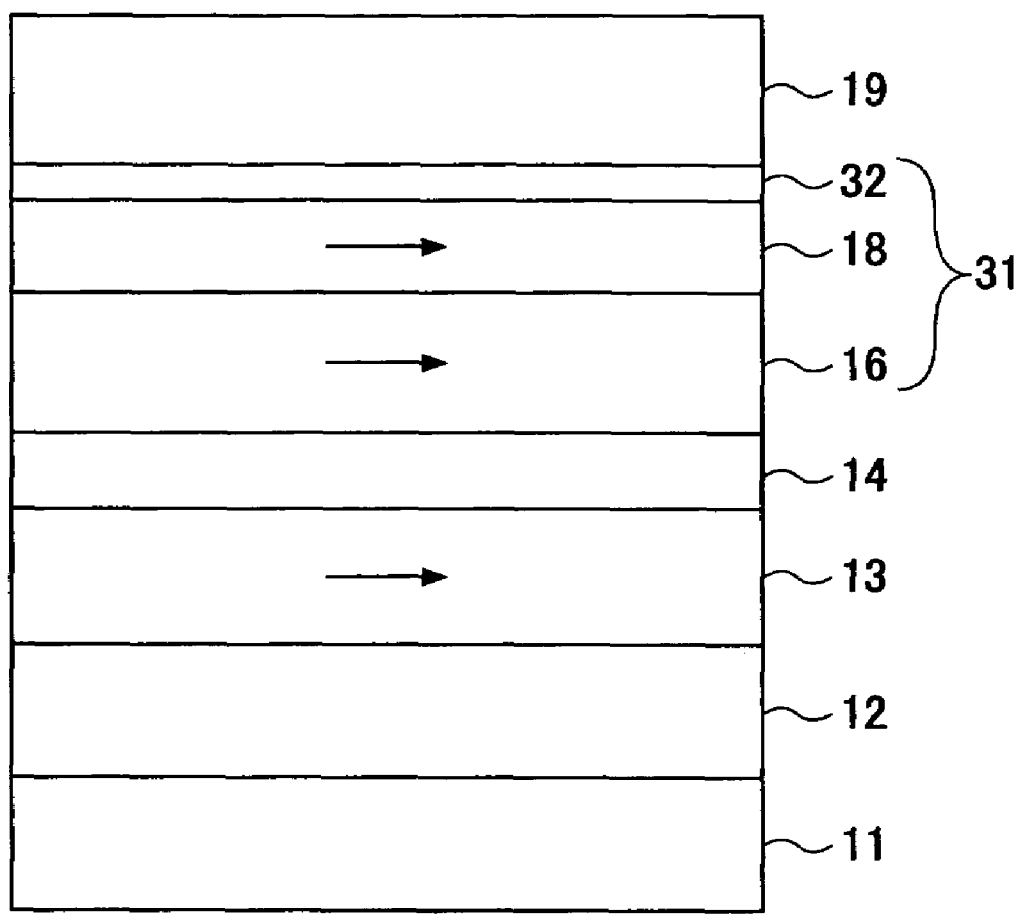
FIG. 9 is a cross-sectional view showing main parts of a ferromagnetic tunnel junction according to a second embodiment of the present invention.

FIG. 9 is a cross-sectional view showing main parts of a ferromagnetic tunnel junction 30 according to a second embodiment of the present invention. Elements identical to those previously described bear the same reference numerals and are not further described herein.

Referring to FIG. 9, the ferromagnetic tunnel junction 30 of the second embodiment includes a under layer 11, an antiferromagnetic layer 12, a pinned magnetic layer 13, a tunnel insulating film 14, a free magnetic multilayer body 31, and a protective film 19, which are stacked in this order. The free magnetic multilayer body 31 includes a first free magnetic layer 16, a second free magnetic layer 18, and a diffusion barrier layer 32, which are stacked in this order from the tunnel insulating film 14 side. The first free magnetic layer 16 and the second free magnetic layer 18 are ferromagnetically coupled with each other. The magnetization directions of the first free magnetic layer 16 and the second free magnetic layer 18 are parallel to each other when no external magnetic field is applied. The ferromagnetic tunnel junction 30 has the same configuration as the ferromagnetic tunnel junction 10 of the first embodiment shown in FIG. 2 except that the diffusion barrier layer 32 of the free magnetic multilayer body 31 is formed on the second free magnetic layer 18.

The diffusion barrier layer 32 is formed of any one of elements selected from the group consisting of Ru, Ti, and Hf. As with the diffusion barrier layer 17 of the first embodiment shown in FIG. 2, the diffusion barrier layer 32 can prevent an additive element M2 of the first free magnetic layer 16 from diffusing into the second free magnetic layer 18. Although the diffusion barrier layer 32 is formed on the upper side of the second free magnetic layer 18, it is confirmed from analysis of Experiment 5 and a multilayer body 4 (described below) that the diffusion barrier layer 32 prevents the diffusion of the additive element M2.

The diffusion barrier layer 32 preferably has a thickness ranging 0.2 nm-20 nm so as to be thick enough to prevent the diffusion of the additive element M2. The diffusion barrier layer 32 prevents the additive element M2 of the first free magnetic layer 16 from diffusing into the second free magnetic layer 18.

[Experiment 6]

A ferromagnetic tunnel junction of Experiment 6 has the same configuration as the ferromagnetic tunnel junction 10 of Experiment 1 except that a free magnetic multilayer body 31 has the configuration described below. A method used in Experiment 6 for fabricating the ferromagnetic tunnel junction is the same as the method used in Experiment 1, and is not further described herein.

Free magnetic multilayer body 31:
    First free magnetic layer 16: $Co_{60}Fe_{20}B_{20}$ (3 nm)
    Second free magnetic layer 18: $Ni_{80}Fe_{20}$ (3 nm)
    Diffusion barrier layer 32: Ru (10 nm)

FIG. 10 is a table showing properties of the ferromagnetic tunnel junctions of Experiment 6 and Comparative Experiments 1 and 2. In FIG. 10, Comparative Experiments 1 and 2 are the same as those in FIG. 4 and are shown for the purpose of explanation.

Referring to FIG. 10, the ferromagnetic tunnel junction of Experiment 6 has a higher TMR ratio than the ferromagnetic tunnel junction of Comparative Experiment 2 that does not include the a diffusion barrier layer. That is, a significant reduction of TMR ratio as in Comparative Experiment 2 is prevented by providing the diffusion barrier layer 32 formed of an Ru film on the second free magnetic layer 18. Although the TMR ratio of the ferromagnetic tunnel junction of Experiment 6 is lower than that of ferromagnetic tunnel junction of Comparative Experiment 1 that does not include a second free magnetic layer, coercivity of the free magnetic multilayer body 31 is lower than that of Comparative Experiment 1. From these facts, it can be seen that the ferromagnetic tunnel junction of Experiment 6 reduces the coercivity of the free magnetic multilayer body 31 while preventing reduction of TMR ratio. Thus, sensitivity to external magnetic fields is improved. The TMR ratio and the coercivity were measured in the same manner as in Experiment 1.

Then, to examine the effect of the diffusion barrier layer 32 of the ferromagnetic tunnel junction 30 of the second embodiment, a multilayer body 4 was fabricated under the same conditions as in above-described Experiment 6. Compositional distribution of the multilayer body 4 was examined by Auger Electron Spectroscopy. Analysis by Auger Electron Spectroscopy is performed under the same conditions as in the case of the multilayer bodies 1-3.

[Multilayer Body 4]

The multilayer body 4 has the same configuration as the multilayer body 1 except that a free magnetic multilayer body has the same configuration as the free magnetic multilayer body 31 of Experiment 6.

Figure 11:
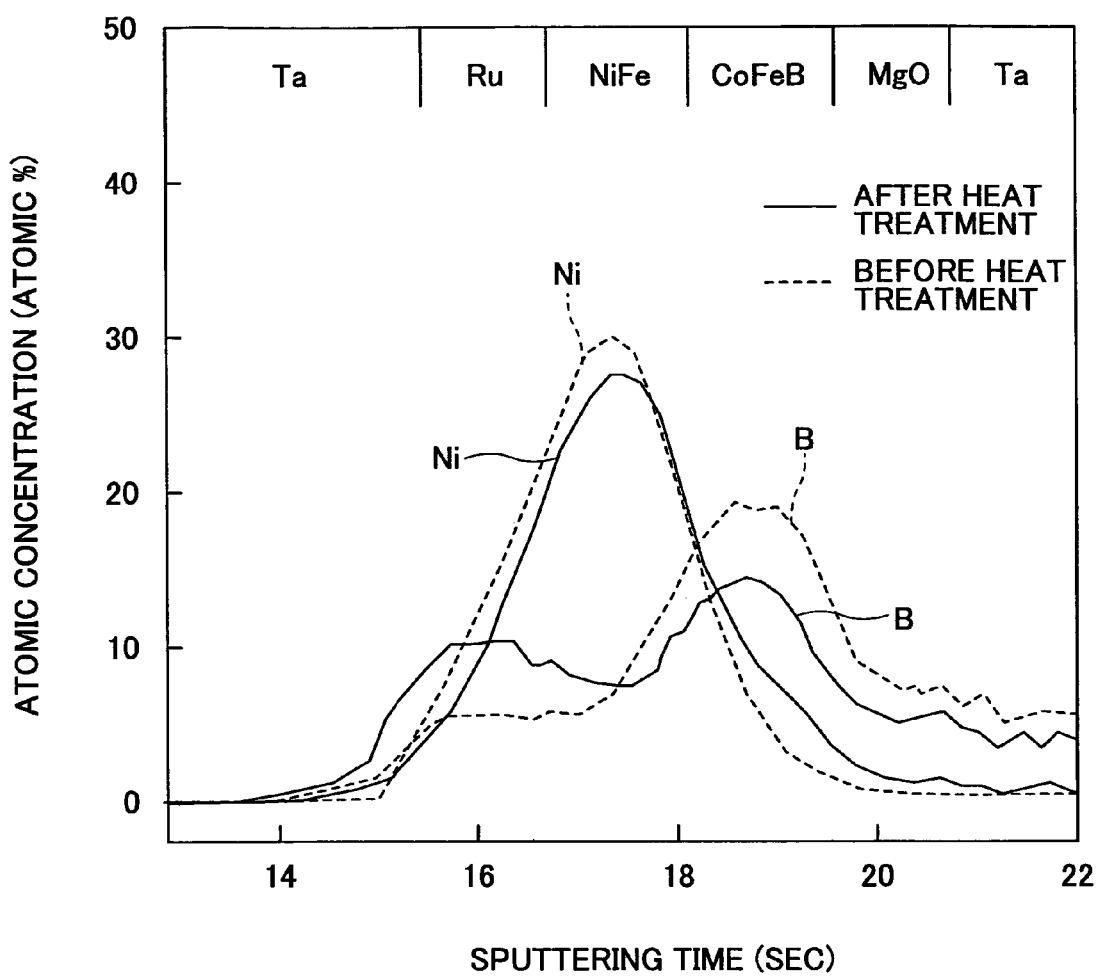
FIG. 11 is a graph showing B and Ni concentration profiles of still another multilayer body in a depth direction before and after a heat treatment.

FIG. 11 is a graph showing B concentration profiles of the multilayer body 4 in a depth direction before and after a heat treatment.

Referring to FIG. 11, in the multilayer body 4, the peak position of the concentration of B contained in a $Co_{60}Fe_{20}B_{20}$ film does not change significantly before and after the heat treatment. Also, the peak position of the concentration of Ni contained in a $Ni_{80}Fe_{20}$ film does not change significantly before and after the heat treatment. From these facts, it can be seen that an Ru film covering the $Ni_{80}Fe_{20}$ film prevents B contained in the $Co_{60}Fe_{20}B_{20}$ film from diffusing into the $Ni_{80}Fe_{20}$ film, and prevents Ni contained in the $Ni_{80}Fe_{20}$ film from diffusing into the $Co_{60}Fe_{20}B_{20}$ film. Although the mechanism of preventing the diffusion described above is unknown, it can be presumed, from the relation between the drop of TMR ratio due to the heat treatment and the diffusion of B or Ni as described in the first embodiment, that the Ru film covering the $Ni_{80}Fe_{20}$ film prevents the diffusion of B and the diffusion of Ni, thereby preventing the drop of TMR ratio.

According to the second embodiment, the ferromagnetic tunnel junction 30 can prevent the additive element M2 from diffusing into the second free magnetic layer 18 because of the presence of the diffusion barrier layer 32 formed on the second free magnetic layer 18. Since the diffusion barrier layer 32 can have a thickness greater than the diffusion barrier layer 17 of the first embodiment, the diffusion barrier layer 32 can be formed more easily.

Third Embodiment

The following describes a dual magnetic head 40 including a reproducing element 60 and an inductive recording element 53 according to a third embodiment of the present invention.

Figure 12:
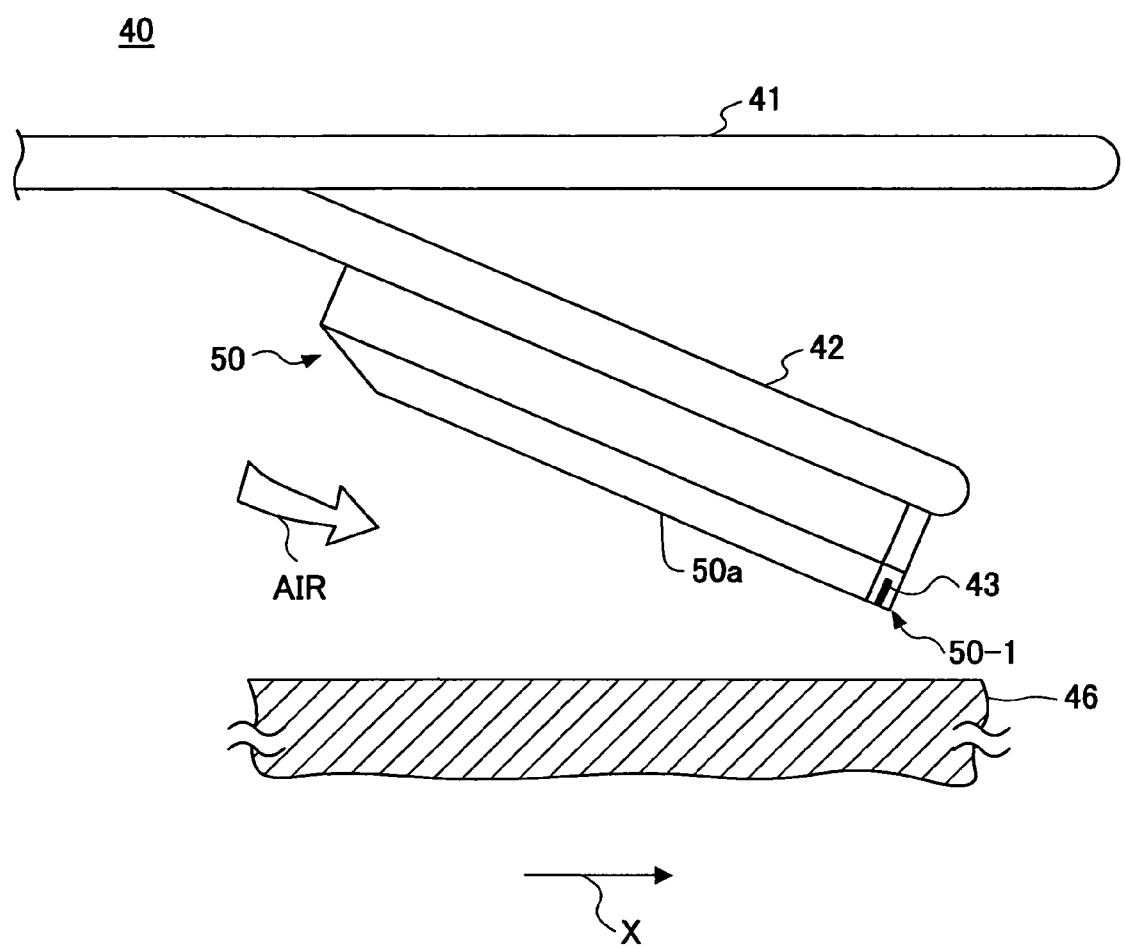
FIG. 12 shows a magnetic head held over a magnetic recording medium according to a third embodiment of the present invention.

FIG. 12 is a cross-sectional view showing the magnetic head 40 of the third embodiment held over a magnetic recording medium 46.

Referring to FIG. 12, the magnetic head 40 of the third embodiment includes a plate suspension 41, and a head slider 50 fixed to a gimbal 42 attached to the tip of the suspension 41. The suspension 41 and the gimbal 42 are connected through a spring member. The head slider 50 comprises an element section 43 including the reproducing element 60 and the inductive recording element 53, which are described below with reference to FIG. 13, at an air injection end 50-1 side on a surface (medium facing surface) 50a facing the magnetic recording medium 46.

The medium facing surface 50a receives a lifting force (upward force) generated by air flowing (in a direction of an arrow AIR) over the magnetic recording medium 46 moving in a direction indicated by an arrow X, so that the magnetic head 40 is lifted. Meanwhile, the suspension 41 supporting the magnetic head 40 applies a downward force on the magnetic head 40. Due to a balance between the upward force and the downward force, the magnetic head 40 is lifted while maintaining a constant lifting level (distance between the surface of the element section 43 and the surface of the magnetic recording medium 46). The element section 43 detects a magnetic field emanating from a recording layer (not shown) of the magnetic recording medium 46.

Figure 13:
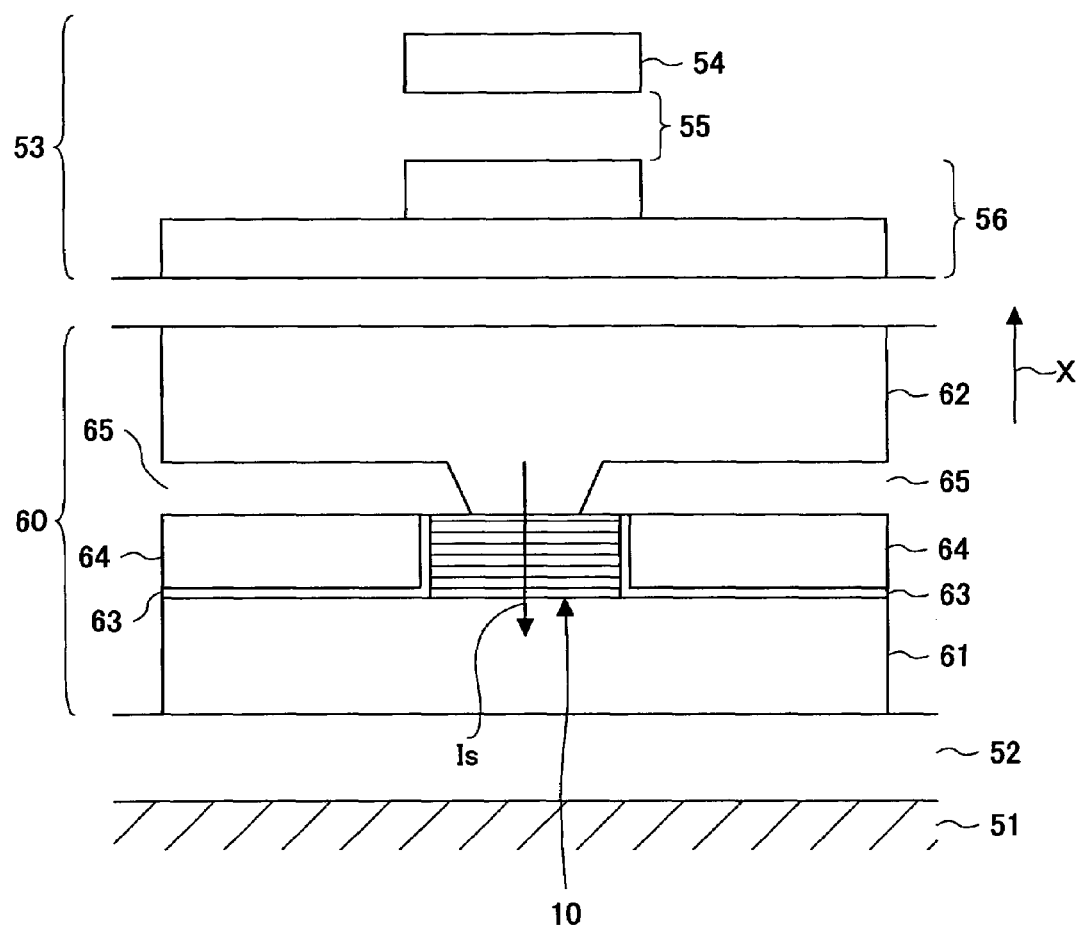
FIG. 13 shows main parts of a head slider disposed at the side facing a magnetic recording medium.

FIG. 13 shows main parts of the head slider 50 of FIG. 12 on the side of the medium facing surface 50a. In FIG. 13, the arrow X indicates a moving direction of the magnetic recording medium 46.

Referring to FIG. 13, the head slider 50 comprises the reproducing element 60 formed over a substrate 51 of $Al_2O_3$—Ti or the like, and the inductive recording element 53 formed on the reproducing element 60.

The inductive recording element 53 includes an upper magnetic pole 54 provided on a medium facing surface thereof and having a width corresponding to a track width of the magnetic recording medium 46, a lower magnetic pole 56 facing the upper magnetic pole 54 over a recording gap layer 55 made of an antimagnetic material, a yoke (not shown) for magnetically connecting the upper magnetic pole 54 to the lower magnetic pole 56, and a coil (not shown) wound around the yoke for inducing a recording magnetic field with a recording current. The upper magnetic pole 54, the lower magnetic pole 56, and the yoke are made of a soft magnetic material having a saturation magnetic flux density high enough to secure the recording magnetic field, such as $Ni_{80}Fe_{20}$, CoZrNb, FeN, FeSiN, FeCo alloys. The configuration of the inductive recording element 53 is not limited to the one having the configuration described above, and other inductive recording elements known in the art may be used. The inductive recording element 53 may alternatively be a perpendicular recording type including a main magnetic pole and a sub magnetic pole.

The reproducing element 60 includes a lower electrode 61, the ferromagnetic tunnel junction 10, an alumina film 65, and an upper electrode 62 electrically connected to the surface of a ferromagnetic tunnel junction 10, which are stacked on an alumina film 52 formed on the surface of the ceramic substrate 51. Magnetic domain control films 64 are provided one on each side of the ferromagnetic tunnel junction 10, with an insulating film 63 interposed therebetween. Each of the magnetic domain control films 64 is a lamination including, for example, a Cr film and a ferromagnetic CoCrPt film stacked from the lower electrode 61 side. The magnetic domain control films 64 separate the pinned magnetic layer 13, the first free magnetic layer 16, and the second free magnetic layer 18 of the ferromagnetic tunnel junction 10 of FIG. 2 from each other to make them single domains, thereby preventing Barkhausen noise.

The lower electrode 61 and the upper electrode 62 are made of a soft magnetic alloy, such as NiFe and CoFe, so as to serve not only as a channel for a sense current Is but also as a magnetic shield. A conductive film, such as a Cu film, a Ta film, and a Ti film, may be provided at the interface between the lower electrode 61 and the ferromagnetic tunnel junction 10.

The reproducing element 60 and the inductive recording element 53 are covered with, e.g., an alumina film or a carbon hydride film in order to prevent corrosion and the like.

Figure 1A:
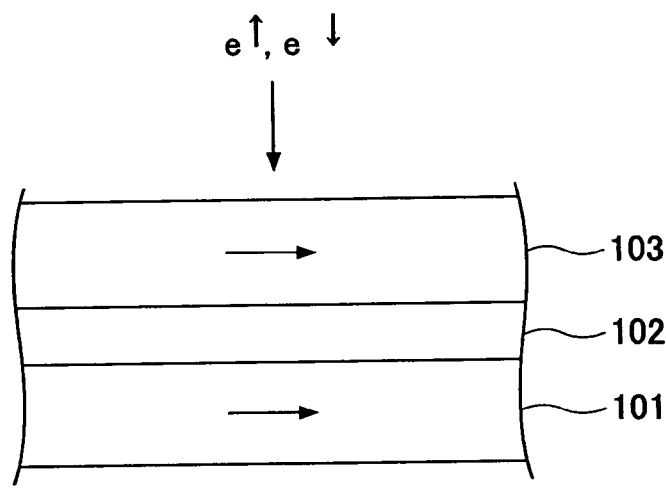
FIGS. 1A and 1B are diagrams for illustrating the principal of a ferromagnetic tunnel junction.
Figure 1B:
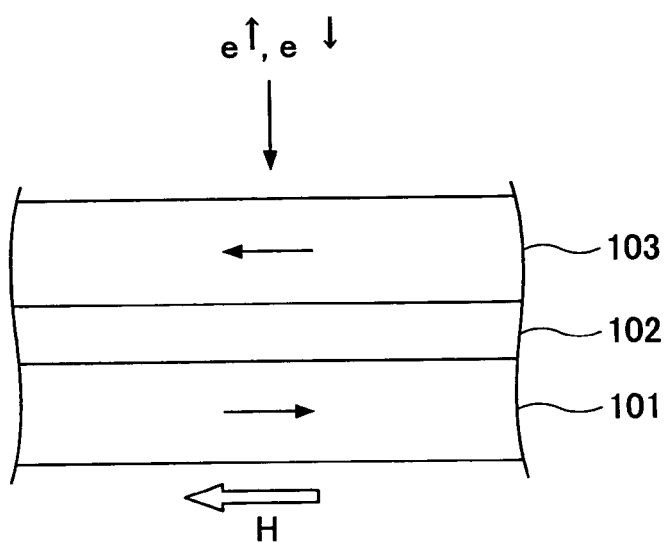

The ferromagnetic tunnel junction 10 used herein is identical to the ferromagnetic tunnel junction 10 of the first embodiment shown in FIG. 2, and is not further described herein. The sense current Is flows, for example, from the upper electrode 62 to the lower electrode 61 substantially perpendicularly to the film face of the ferromagnetic tunnel junction 10. The tunneling resistance of the ferromagnetic tunnel junction 10 changes in accordance with the intensity and the direction of the magnetic field emanating from the magnetic recording medium 46. The reproducing element 60 detects, for example, the change of the tunneling resistance of the ferromagnetic tunnel junction 10 as a voltage change. In this way, the reproducing element 60 reproduces information recorded in the magnetic recording medium 46. The flow direction of the sense current Is is not limited to the direction shown in FIG. 1, and the sense current Is may flow in the opposite direction. The magnetic recording medium 46 may move in the opposite direction.

The ferromagnetic tunnel junction 20 of FIG. 3 or ferromagnetic tunnel junction 30 of FIG. 9 may be used in place of the ferromagnetic tunnel junction 10.

The magnetic head 40 of the third embodiment has a high SNR because the reproducing element 60 includes the ferromagnetic tunnel junction 10 having a high TMR ratio. Accordingly, signals detected by the magnetic head 40 have high SNR even if the intensity of the magnetic field emanating from the magnetic recording medium 46 is lowered due to increase of recording density. Therefore, the magnetic head 40 is suitable for high recording density.

By forming the second free magnetic layer 18 of the ferromagnetic tunnel junction 10 of FIG. 2 with a material having a lower coercivity than the material of the first free magnetic layer 16, the sensitivity of the magnetic head 40 to the magnetic field emanating from the magnetic recording medium 46 is increased. The magnetic head 40 is suitable for high recording density in this point as well.

Fourth Embodiment

Figure 14:
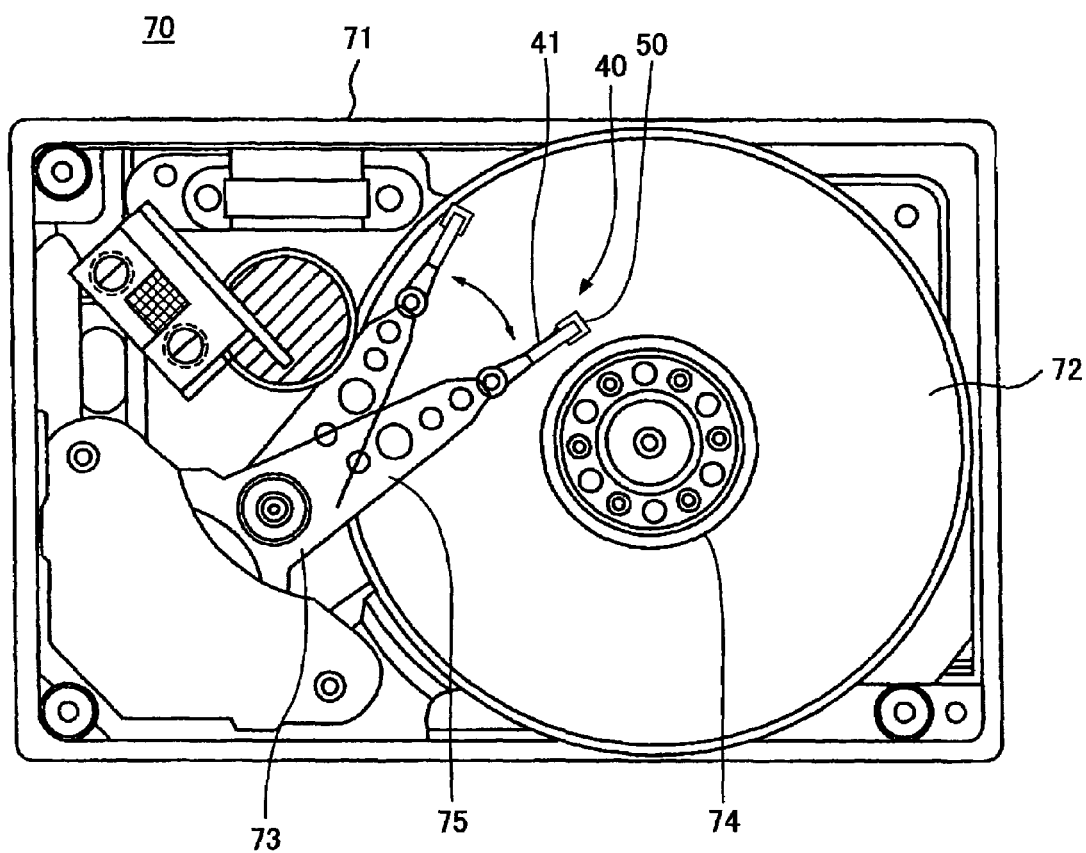
FIG. 14 shows main parts of a magnetic recording device according to a fourth embodiment of the present invention.

FIG. 14 is a cross-sectional view showing main parts of a magnetic recording device 70 according to a fourth embodiment of the present invention.

Referring to FIG. 14, a magnetic recording device 70 of the fourth embodiment includes a housing 71, a disk-type magnetic recording medium 72, a magnetic head 40, and an actuator unit 73. The magnetic recording medium 72, the magnetic head 40, and the actuator unit 73 are stored inside the housing 71. The magnetic recording medium 72 is fixed to a hub 74 and driven by a spindle motor (not shown). A base part of a suspension 41 of the magnetic head 40 is fixed to an arm 75 such that the magnetic head 40 is attached to the actuator unit 73 through the arm 75. The magnetic head 40 is rotated in a radial direction of the magnetic recording medium 72 by the actuator unit 73. An electronic substrate (not shown) serving for recording control, reproduction control, magnetic head position control, and spindle motor control is provided at a rear side of the housing 71.

The magnetic recording medium 72 may be an in-plane magnetic recording medium in which the direction of a magnetic easy axis of a recording layer is parallel to the face of the recording layer. The in-plane recording medium comprises, for example, a under layer of Cr or Cr alloy, the recording layer of CoCrPt alloy, a protective film, and a lubricating layer, which are stacked in this order on a substrate. The magnetic easy axis of the recording layer is parallel to the layer face due to the action of the under layer.

The magnetic recording medium 72 may alternatively be a perpendicular magnetic recording medium in which the direction of a magnetic easy axis of a recording layer is perpendicular to the face of the recording layer. The perpendicular magnetic recording medium comprises, for example, a soft magnetic backing layer, a middle layer, the recording layer formed of a perpendicular magnetic film, a protective film, and a lubricating layer, which are stacked in this order on a substrate. The recording layer has a ferromagnetic polycrystalline structure formed of, e.g., CoCrPt, or a columnar granular structure formed of $CoCrPt$—$SiO_2$. The magnetic easy axis of the recording layer is substantially perpendicular to the layer face due to the action of the middle layer or the recording layer itself. Because magnetization recorded in the perpendicular magnetic recording medium is more thermostable compared to the in-plane magnetic recording medium, the perpendicular magnetic recording medium can achieve higher recording density than the in-plane magnetic recording medium.

The magnetic recording medium 72 may also be an oblique magnetic recording medium in which the direction of a magnetic easy axis of a recording layer is inclined with respect to the face of the recording layer. The oblique recording medium comprises, for example, a under layer of Cr or Cr alloy, the recording layer of CoCrPt alloy, a protective film, and a lubricating layer, which are stacked in this order on a substrate. The deposition direction of crystal grains of the under layer is inclined with respect to the layer surface, so that the orientation of the crystal grains of the under layer is inclined with respect to the layer face. Because of such inclination in the under layer, the magnetic easy axis of the recording layer is inclined with respect to the face of the recording layer. The recording layer of this type is easily recordable because the magnetization direction of the recording layer is reversed by a recording magnetic field from the magnetic head 40 having lower intensity. Since the oblique magnetic recording medium is easily recordable, the oblique magnetic recording medium can achieve higher recording density than the in-plane and perpendicular magnetic recording media.

The magnetic head 40 is identical to the magnetic head of the third embodiment. The reproducing element 60 of the magnetic head 40 has a high SNR. Therefore, the magnetic recording device 70 of the fourth embodiment can detect signals even when the intensity of the magnetic field emanating from the magnetic recording medium 46 is lowered due to an increase of recording density, and the signals detected by the magnetic head 40 have a high SNR. Therefore, the magnetic recording device 70 is suitable for high recording density.

The basic configuration of the magnetic recording device 70 is not limited to the configuration shown in FIG. 14. The magnetic recording medium 72 is not limited to disk types. For example, the magnetic recording device 70 may be a helical scan type or lateral type magnetic tape device. In the case where of a helical scan type magnetic tape device, the magnetic head 40 is mounted on a cylinder head. In the case where of a lateral type magnetic tape device, the magnetic head 40 is mounted on a head block contacted by the magnetic tape running in a longitudinal direction.

Fifth Embodiment

Figure 15:
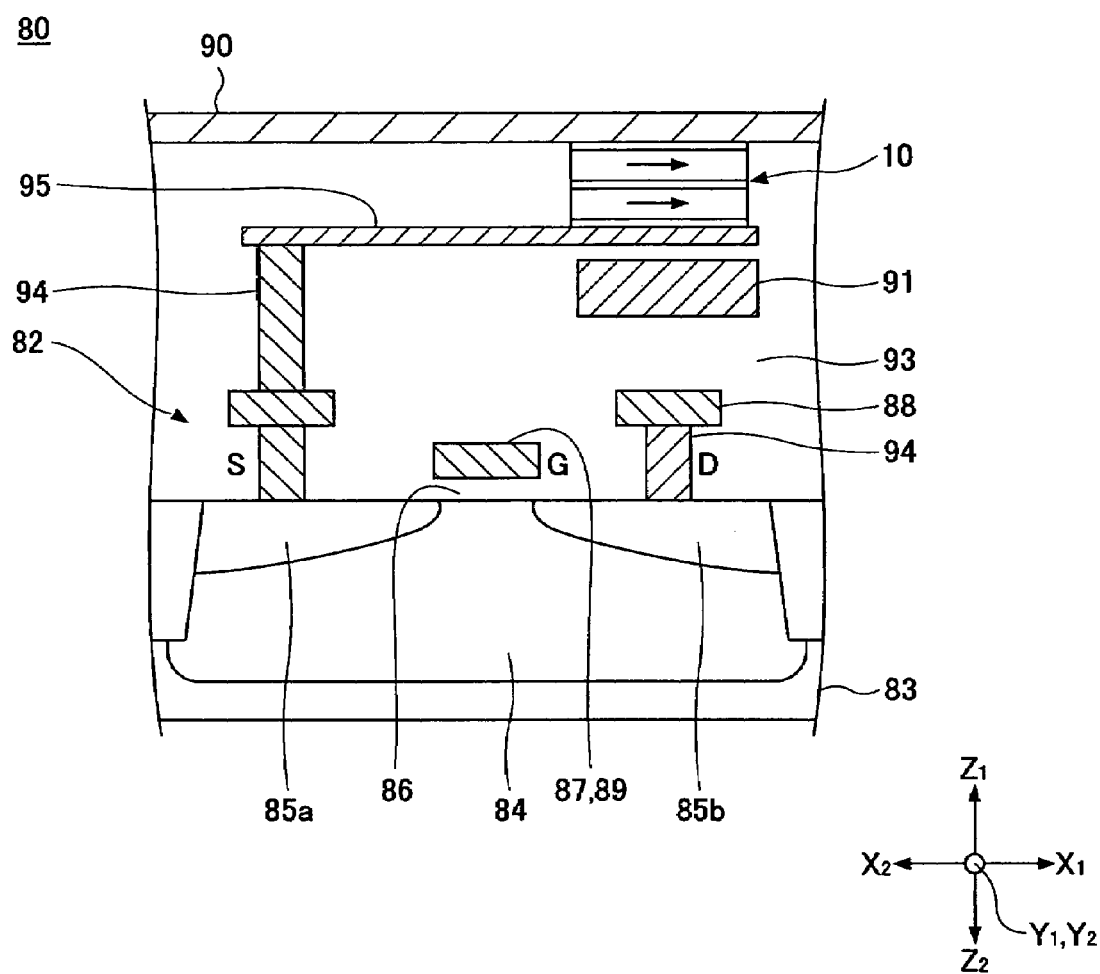
FIG. 15 is a cross-sectional view showing a magnetic memory device according to a fifth embodiment of the present invention.
Figure 16:
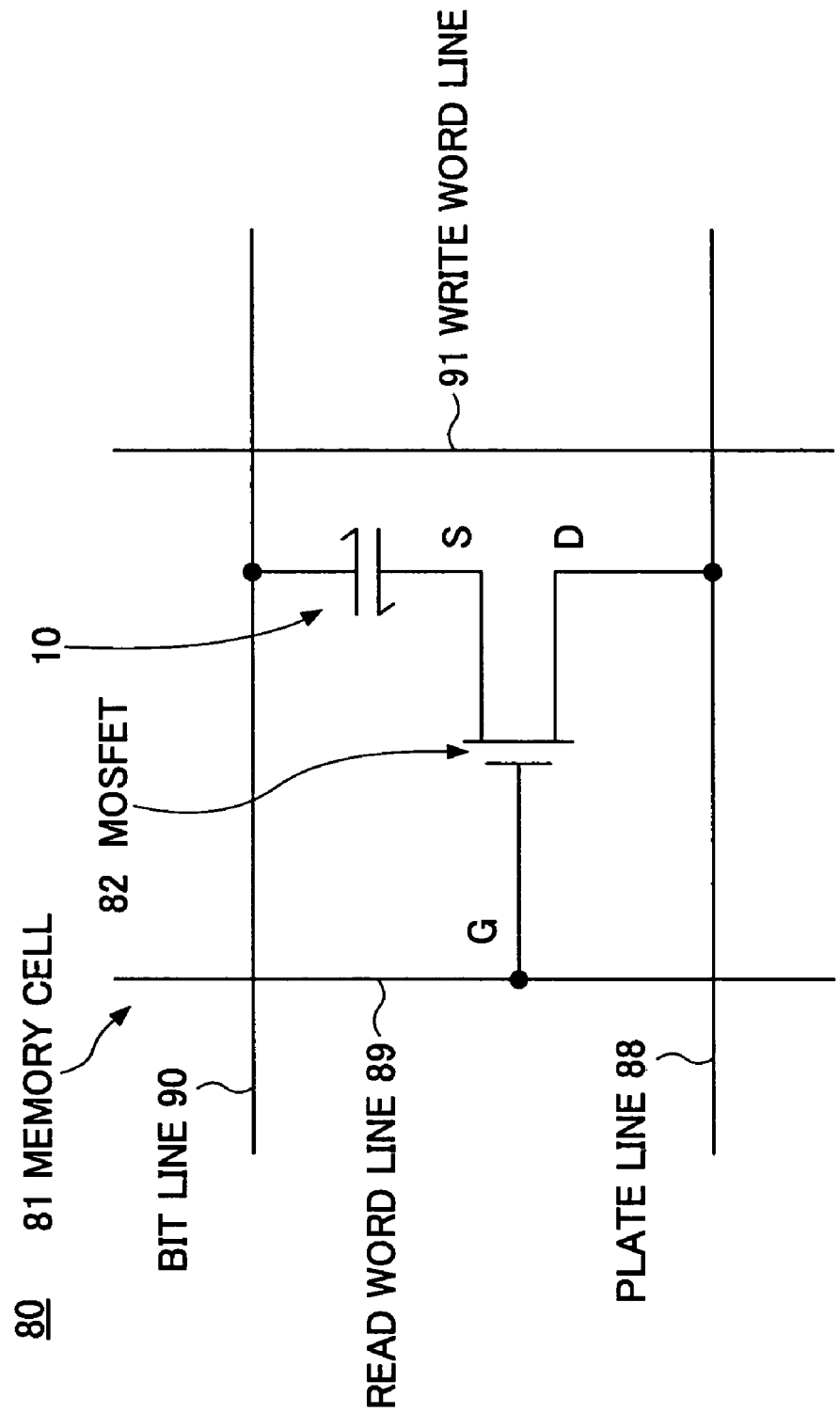
FIG. 16 is a schematic diagram showing an equivalent circuit of a memory cell in the magnetic memory device of FIG. 15.

FIG. 15 is a cross-sectional view showing a magnetic memory device 80 according to a fifth embodiment of the present invention. FIG. 16 is a schematic diagram showing an equivalent circuit of a memory cell in the magnetic memory device 80 of FIG. 15. In FIG. 15, coordinate axes are also shown for indicating directions. $Y_1$-$Y_2$ directions indicate the directions orthogonal to the paper showing FIG. 14. $Y_1$ direction indicates the direction toward the rear side of the paper, and $Y_2$ direction indicates the direction toward the front side of the paper. In the following description, for example, X direction is used to refer to either $X_1$ direction or $X_2$ direction. The same applies to Y direction and Z direction.

Referring to FIGS. 15 and 16, the magnetic memory device 80 comprises multiple memory cells, each including a ferromagnetic tunnel junction 10 and a MOS field-effect transistor (MOSFET) 82. Although both p-channel MOSFETs and n-channel MOSFETs are suitable as the MOSFETs 82, the magnetic memory device 80 exemplified herein includes n-channel MOSFETs in which electrons serve as carriers.

Each of the MOSFETs 82 includes a p-type well region 84 containing p-type impurities, and impurity diffusion regions 85*a* and 85*b* formed apart from each other inside the p-type well region 84 near the surface of a silicon substrate 83. The impurity diffusion region 85*a* is used as a source S, while the impurity diffusion region 85*b* is used as a drain D. A gate electrode 87 is provided on the surface of the silicon substrate 83 between the impurity diffusion regions 85*a* and 85*b*. A gate insulating film 86 is interposed between the gate electrode 87 and the surface of the silicon substrate 83.

One side of the ferromagnetic tunnel junction 10, e.g., the under layer 11 shown in FIG. 2 is electrically connected to the source S of the MOSFET 82. The drain D is electrically connected to a plate line 88. The gate electrode 87 is electrically connected to a read word line 89. Alternatively, the gate electrode 87 may incorporate the function of the read word line 89.

The ferromagnetic tunnel junction 10 has the same configuration as the ferromagnetic tunnel junction 10 of FIG. 12 although not shown in detail in FIGS. 15 and 16. In the ferromagnetic tunnel junction 10, magnetic easy axes of the first and second free magnetic layers 16 and 18 are aligned in the X direction, and magnetic hard axes thereof are aligned in the Y direction. The magnetic easy axes may be formed by a heat treatment or by utilizing shape anisotropy. In the case where the magnetic easy axes are formed in the X direction by utilizing shape anisotropy, the cross section parallel to the layer face of the ferromagnetic tunnel junction 10 (the cross section parallel to an X-Y plane) is formed in a rectangular shape elongated in the X direction.

The other side of the ferromagnetic tunnel junction 10, e.g., the protective film 19 shown in FIG. 2 is electrically connected to a bit line 90. A write word line 91 is provided separately at the lower side of the ferromagnetic tunnel junction 10.

In the magnetic memory device 80, the surface of the silicon substrate 83 and the gate electrode 87 are covered with an interlayer insulating film 93 formed of a silicon nitride film or a silicon oxide film. The ferromagnetic tunnel junction 10, the plate line 88, the read word line 89, the bit line 90, the write word line 91, a vertical wiring portion 94, and an inner wiring portion 95 are insulated from each other by the interlayer insulating film 93 except for the electrical connections described above.

The following describes write operations and read operations of the magnetic memory device 80. When the magnetic memory device 80 writes information into the ferromagnetic tunnel junction 10, the bit line 90 and the write word line 91 arranged on the upper and lower sides of the ferromagnetic tunnel junction 10 are used. The bit line 90 extends at the upper side of the ferromagnetic tunnel junction 10 in the X direction. When current flows through the bit line 90, a magnetic field is applied to the ferromagnetic tunnel junction 10 in the Y direction. The write word line 91 extends at the lower side of the ferromagnetic tunnel junction 10 in the Y direction. When current flows through the write word line 91, a magnetic field is applied to the ferromagnetic tunnel junction in the X direction.

The magnetizations of the first and second free magnetic layers 16 and 18 of the ferromagnetic tunnel junction 10 are stably oriented in the X direction (e.g., $X_2$ direction) when substantially no magnetic field is applied. The magnetizations of the first and second free magnetic layers 16 and 18 are parallel to each other as they are ferromagnetically coupled with each other. The magnetizations of the first and second free magnetic layers 16 and 18 are referred to as simply "magnetization of the free magnetic multilayer body 15" for explanation purpose.

When information is written in the ferromagnetic tunnel junction 10, current is applied simultaneously to the bit line 90 and the write word line 91. For example, for orienting the magnetization of the free magnetic multilayer body 15 in the $X_1$ direction, the direction of the current to be applied to the write word line 91 is set to the $Y_1$ direction. Thus, the magnetic field is oriented in the $X_1$ direction in the ferromagnetic tunnel junction 10. The direction of the current to be applied to the bit line 90 may be set to either one of the $X_1$ direction and the $X_2$ direction. A magnetic field produced by the current flowing through the bit line 90 is oriented in the $Y_1$ direction and the $Y_2$ direction so as to form a part of a magnetic field that causes the magnetization of the free magnetic multilayer body 15 to cross the magnetic hard axes. Namely, the magnetic field in the $X_1$ direction and the magnetic field in the $Y_1$ or $Y_2$ direction are simultaneously applied to the magnetization of the free magnetic multilayer body 15, so that the direction of the magnetization of the free magnetic multilayer body 15 is changed from the $X_2$ direction to the $X_1$ direction. Even after the magnetic fields are removed, the magnetization of the free magnetic multilayer body 15 stably remains in the $X_1$ direction unless a magnetic field for another write operation or a magnetic field for an erase operation is applied. The magnitude of the magnetic field to be applied to reverse the magnetization of the free magnetic multilayer body 15 is as follows.

Depending on the magnetization direction of the free magnetic multilayer body 15, "1" or "0" is recorded in the ferromagnetic tunnel junction 10. For example, when the magnetization of the pinned magnetic layer 13 is oriented in the $X_1$ direction, "1" may be set when the magnetization of the free magnetic multilayer body 15 is oriented in the $X_1$ direction (state in which tunneling resistance is low), and "0" may be set when the magnetization of the free magnetic multilayer body 15 is oriented in the $X_2$ direction (state in which tunneling resistance is high).

The amount of the current is adjusted such that the magnetization of the free magnetic multilayer body 15 is not reversed when the current is applied to only one of the bit line 90 and the write word line 91 in a write operation. Therefore, information is recorded only in the magnetization of the free magnetic multilayer body 15 of the ferromagnetic tunnel junction 10 located on the intersection of the bit line 90 to which the current is supplied and the write word line to which the current is supplied.

The source S side is set to high impedance so as to prevent the current from flowing to the ferromagnetic tunnel junction 10 when the current is supplied to the bit line 90 in a write operation.

In an operation for reading information from the magnetic memory device 80 of the ferromagnetic tunnel junction 10, a negative voltage with respect to the source S is applied to the bit line 90, while a voltage (positive voltage) higher than a threshold voltage of the MOSFET 82 is applied to the read word line 89, i.e., the gate electrode 87. Thus, the MOSFET 82 is turned on, so that electrons flow from the bit line 90, through the ferromagnetic tunnel junction 10, the source S, and the drain D, to the plate line 88. The tunneling resistance due to a ferromagnetic tunnel effect corresponding to the magnetization direction of the free magnetic multilayer body 15 is detected based on the amount of flowing electrons per unit time, i.e., the current value. In this way, the magnetic memory device 80 can read out information "1" or "0" held by the ferromagnetic tunnel junction 10.

As described in the first embodiment, the diffusion barrier layer 17 that prevents the diffusion of the additive element M2 is provided between the first free magnetic layer 16 and the second free magnetic layer 18 in the free magnetic multilayer body 15, so that the ferromagnetic tunnel junction 10 can prevent the lowering of the tunneling resistance due to heat treatments.

Accordingly, the difference between the tunneling resistances corresponding to the information "0" and "1" is large enough to allow the magnetic memory device 80 to correctly read out the information. By forming the second free magnetic layer 18 of the free magnetic multilayer body 15 with the material having coercivity lower than the material of the first free magnetic layer 16, a magnetic field to be applied for write operations can be reduced. Accordingly, the value of the current supplied to the bit line 90 and the write word line 91 for write operations can be reduced, and therefore energy consumption of the magnetic memory device 80 can be reduced.

The magnetic memory device 80 is excellent in heat resistance in that the TMR ratio of the ferromagnetic tunnel junction 10 due to heat treatments is reduced. Accordingly, heating temperature restrictions in processes performed at high temperature, such as a process for forming the interlayer insulating film by a CVD method, are eased.

The ferromagnetic tunnel junction 10 may be replaced with the ferromagnetic tunnel junction 20 of FIG. 3 or the ferromagnetic tunnel junction 30 of FIG. 9. Although the protective film 19 and the under layer 11 of the ferromagnetic tunnel junction 10 are connected to the bit line 90 and the source S, respectively, in the above embodiment, the protective film 19 and the under layer 11 may be connected to the source S and the bit line 90, respectively.

The configuration of the magnetic memory device 80 is not limited to the configuration described in the fifth embodiment. Any one of the ferromagnetic tunnel junctions 10, 20, and 30 shown in FIGS. 2, 3, and 9 may be used as a ferromagnetic tunnel junction of existing magnetic memory devices.

The present invention is not limited to the specifically disclosed embodiments, and variations and modifications may be made without departing from the scope of the present invention.

The present application is based on Japanese Priority Application No. 2005-142748, filed on May 16, 2005, with the Japanese Patent Office, the entire contents of which are hereby incorporated by reference.

What is claimed is:

1. A ferromagnetic tunnel junction, comprising:
   a pinned magnetic layer;
   a tunnel insulating film formed on the pinned magnetic layer; and
   a free magnetic multilayer body formed on the tunnel insulating film;
   wherein the free magnetic multilayer body includes a first free magnetic layer, a diffusion barrier layer, and a second free magnetic layer stacked in this order on the tunnel insulating film, the first free magnetic layer and the second free magnetic layer being ferromagnetically coupled with each other,
   a magnetization direction of the first free magnetic layer and a magnetization direction of the second free magnetic layers being parallel to each other,
   the first free magnetic layer containing CoFe and at least one additive element selected from the group consisting of B, C, Al, Si, Zr, and P; and
   the diffusion barrier layer being formed of any one of the elements selected from the group consisting of Ta, Ti and Hf, the diffusion barrier layer inhibiting the additive element contained in the first free magnetic layer from diffusing into the second free magnetic layer.

2. The ferromagnetic tunnel junction as claimed in claim 1, wherein the second free magnetic layer is made of a material having lower coercivity than the first free magnetic layer.

3. The ferromagnetic tunnel junction as claimed in claim 1, wherein the tunnel insulating film is formed of any one of an oxide, a nitride, and an oxynitride of any one of elements selected from the group consisting of Mg, Al, Ti, and Zr.

4. The ferromagnetic tunnel junction as claimed in claim 3, wherein the tunnel insulating film is formed of MgO whose (001) face is parallel to a face of the film; and
   the pinned magnetic layer is formed of CoFe, or formed of CoFe and at least one additive element selected from the group consisting of B, C, Al, Si, Zr, and P.

5. A magnetic head comprising:
   the ferromagnetic tunnel junction of claim 1.

6. A magnetic recording device, comprising:
   the magnetic head of claim 5; and
   a magnetic recording medium.

7. A magnetic memory device, comprising:
   the ferromagnetic tunnel junction of claim 1;
   a writing unit configured to apply a magnetic field to the ferromagnetic tunnel junction so as to orient magnetizations of the first free magnetic layer and the second free magnetic layer into predetermined directions; and
   a reading unit configured to supply a sense current to the ferromagnetic tunnel junction so as to detect a tunneling resistance.

8. A magnetic memory device as claimed in claim 7, further comprising:
   bit lines and word lines crossing but not in contact with each other to form memory cells in a matrix form;
   wherein the bit lines and the word lines are arranged in a direction perpendicular to a layer face of the ferromagnetic tunnel junction, interposing a plurality of the ferromagnetic tunnel junctions therebetween; and
   the writing unit is configured to supply current simultaneously to at least one of the bit lines and at least one of the word lines, thereby applying a magnetic field parallel and perpendicular to faces of the first free magnetic layer and the second free magnetic layer of the corresponding ferromagnetic tunnel junction so as to orient the magnetizations of the first free magnetic layer and the second free magnetic layer to the predetermined directions.

9. The magnetic memory device as claimed in claim 7, wherein each of the memory cells includes a second word line and a MOS field effect transistor including a control electrode and two current supply electrodes;

the second word line is electrically connected to the control electrode;

the ferromagnetic tunnel junction is connected between one of the bit lines and either one of the current supply electrodes; and the reading unit turns on the MOS field effect transistor by setting the second word line to a predetermined voltage, supplies a sense current between said one of the bit lines and said either one of the current supply electrodes, and detects a tunneling resistance.

* * * * *